(12) United States Patent
Kijima et al.

(10) Patent No.: US 7,163,828 B2
(45) Date of Patent: Jan. 16, 2007

(54) ELECTRODE, METHOD OF MANUFACTURING THE SAME, FERROELECTRIC MEMORY, AND SEMICONDUCTOR DEVICE

(75) Inventors: Takeshi Kijima, Matsumoto (JP); Koji Ohashi, Chino (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 137 days.

(21) Appl. No.: 10/805,238

(22) Filed: Mar. 22, 2004

(65) Prior Publication Data

US 2004/0241973 A1  Dec. 2, 2004

(30) Foreign Application Priority Data

Mar. 24, 2003  (JP) .............................. 2003-080232
Jul. 17, 2003  (JP) .............................. 2003-275928

(51) Int. Cl.
*H01L 21/00* (2006.01)

(52) U.S. Cl. ...................................... 438/3; 257/21.663

(58) Field of Classification Search ................ 257/295, 257/E21.663; 438/3
See application file for complete search history.

(56) References Cited

U.S. PATENT DOCUMENTS

| 6,117,689 | A | * | 9/2000 | Summerfelt | 438/3 |
| 6,534,357 | B1 | * | 3/2003 | Basceri et al. | 438/239 |
| 6,545,856 | B1 | * | 4/2003 | Norga et al. | 361/311 |
| 2002/0030210 | A1 | | 3/2002 | Matsui et al. | |
| 2002/0102826 | A1 | | 8/2002 | Shimamoto et al. | |

FOREIGN PATENT DOCUMENTS

JP    A 2003-213402    7/2003

OTHER PUBLICATIONS

Stanley Wolf "Silicon Processing for the VLSI Era vol. 1: Process Technology" 1986 pp. 335 and 375.*

* cited by examiner

*Primary Examiner*—Bradley K. Smith
(74) *Attorney, Agent, or Firm*—Oliff & Berridge, PLC

(57) ABSTRACT

The present invention relates to a method of manufacturing an electrode which includes forming an electrode over a substrate. Initial crystal nuclei of an electrode material are formed over the substrate in an island pattern, and then grown layers of the electrode material are formed by causing the initial crystal nuclei to be grown. A substrate temperature when forming the initial crystal nuclei is higher than a substrate temperature when forming the grown layers.

10 Claims, 21 Drawing Sheets

100nm

80nm

25nm

15nm

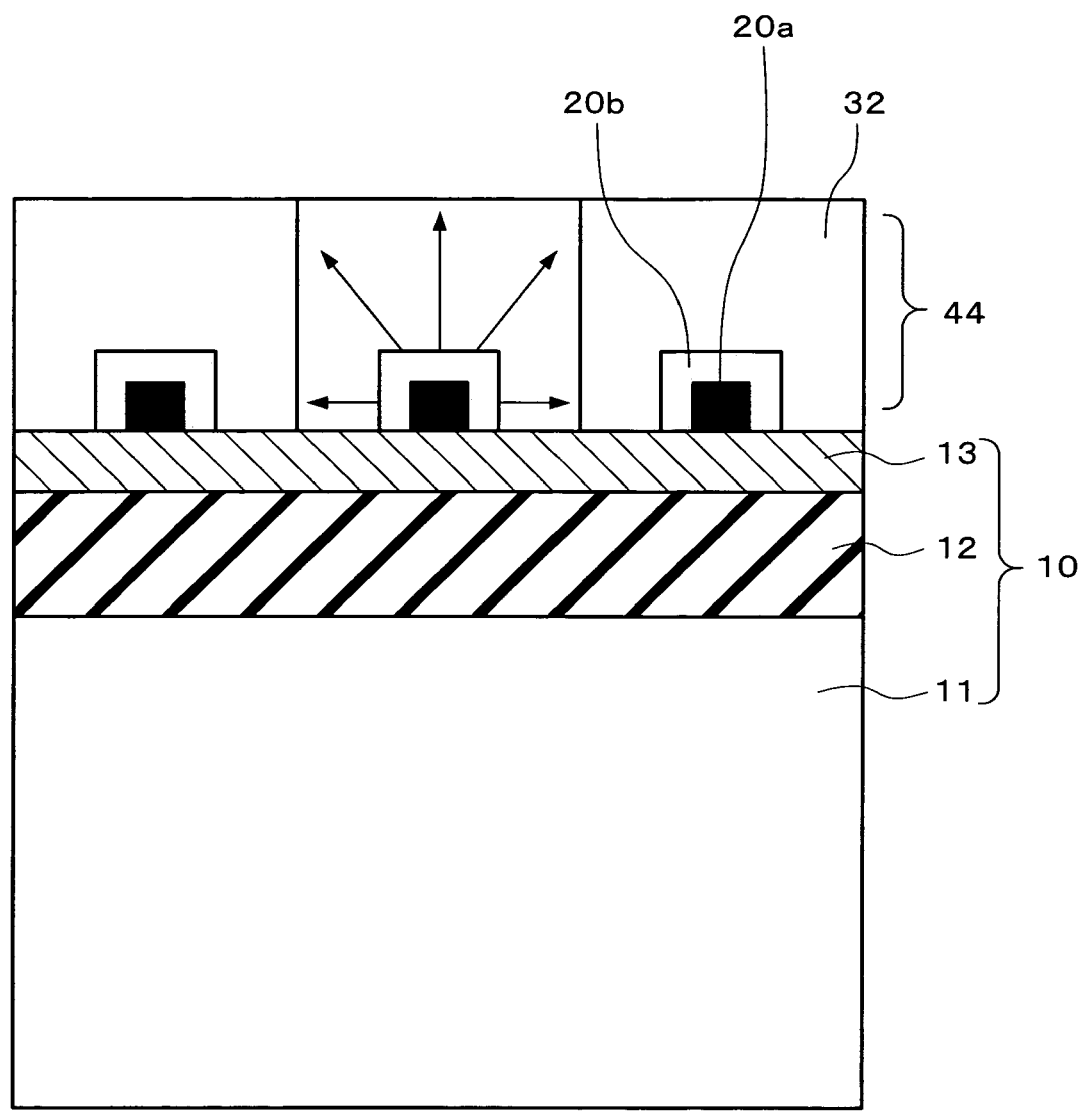

200 μm SQUARE

45 μm SQUARE

5 μm SQUARE

3 μm SQUARE

ELECTRODE, METHOD OF MANUFACTURING THE SAME, FERROELECTRIC MEMORY, AND SEMICONDUCTOR DEVICE

Japanese Patent Application No. 2003-80232, filed on Mar. 24, 2003, and Japanese Patent Application No. 2003-275928, filed on Jul. 17, 2003, are hereby incorporated by reference in their entirety.

BACKGROUND OF THE INVENTION

The present invention relates to an electrode, a method of manufacturing the same, a ferroelectric memory, and a semiconductor device.

A ferroelectric memory (FeRAM) retains data by spontaneous polarization of a ferroelectric capacitor using a ferroelectric film. In recent years, a semiconductor device using the ferroelectric memory has attracted attention.

An electrode of the ferroelectric memory is required to have excellent crystallinity and have no gaps from the viewpoint of crystal orientation of the ferroelectric film interposed between the electrodes and reducing diffusion of constituent elements of the ferroelectric film.

Conventionally, the electrode is formed by using a sputtering method at a high substrate temperature, for example. The resulting electrode has excellent crystallinity. However, as shown in FIG. 20, an electrode 100 formed over a substrate 10 by using the sputtering method becomes a columnar or granular crystal having a comparatively large number of grain boundaries. As a result, diffusion of the material for the ferroelectric film formed between the electrodes occurs, whereby characteristics of the ferroelectric memory may be adversely affected. Moreover, if the substrate temperature when forming the electrode is high, the resulting electrode has poor surface flatness in the same manner as the electrode 100 shown in FIG. 20.

BRIEF SUMMARY OF THE INVENTION

The present invention may provide an electrode having a few grain boundaries and having excellent crystallinity and flatness, and a method of manufacturing the same. The present invention may also provide a ferroelectric memory and a semiconductor device using the electrode.

According to one aspect of the present invention, there is provided a method of manufacturing an electrode over a substrate, the method comprising:

(a) forming initial crystal nuclei of an electrode material over the substrate in an island pattern; and (b) forming grown layers of the electrode material by causing the initial crystal nuclei to be grown, wherein a substrate temperature in the step (a) is higher than a substrate temperature in the step (b).

BRIEF DESCRIPTION OF THE SEVERAL VIEWS OF THE DRAWING

FIG. 9 is a cross-sectional view schematically showing an electrode according to an example of a method of manufacturing a second electrode.

Figure 19A:
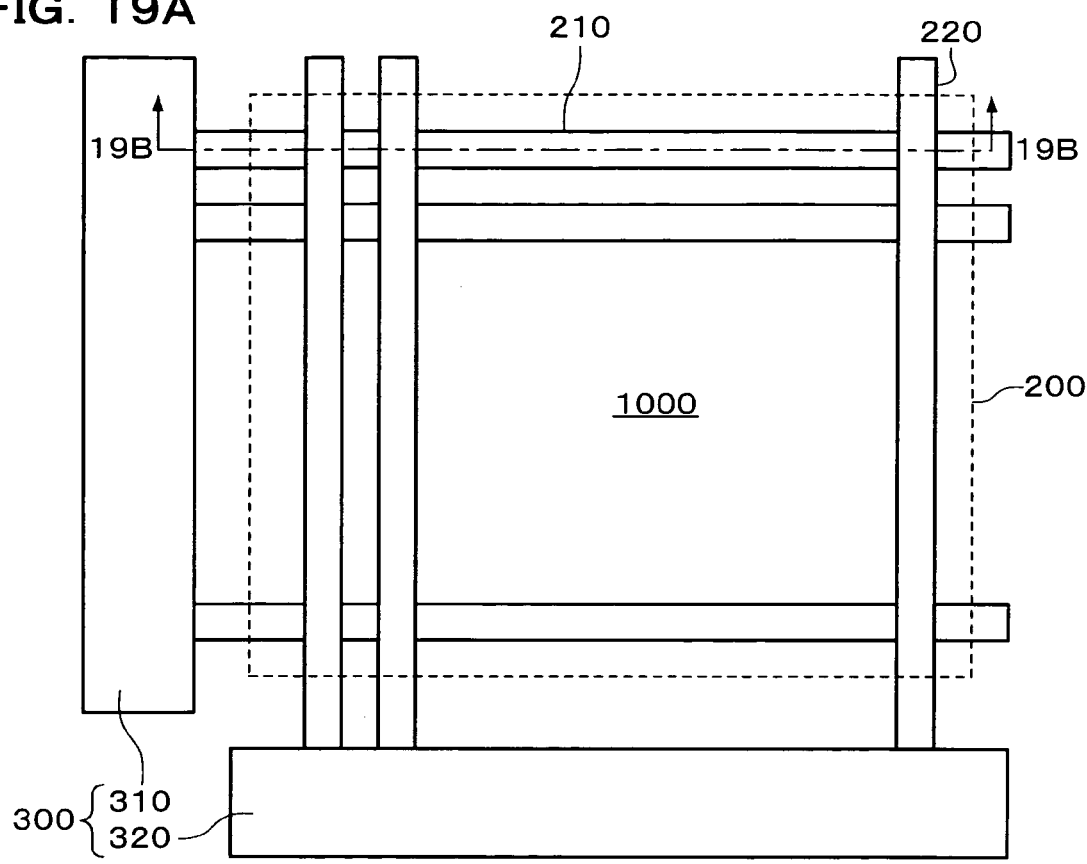
FIG. 19A is a plan view schematically showing a semiconductor device to which an electrode according to an embodiment of the present invention is applied; and FIG.

19B is a view showing a cross section along the line 19B—19B shown in FIG. 19A.

Figure 20:
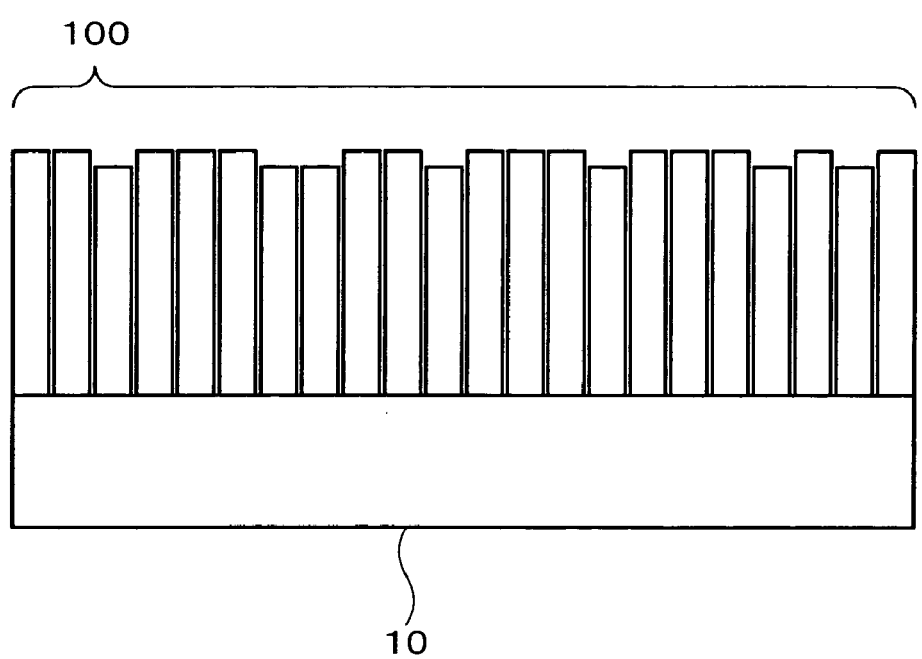

FIG. 20 is a view schematically showing an electrode formed by using a conventional manufacturing method.

DETAILED DESCRIPTION OF THE EMBODIMENT (1) According to one embodiment of the present invention, there is provided a method of manufacturing an electrode over a substrate, the method comprising:

(a) forming initial crystal nuclei of an electrode material over the substrate in an island pattern; and (b) forming grown layers of the electrode material by causing the initial crystal nuclei to be grown, wherein a substrate temperature in the step (a) is higher than a substrate temperature in the step (b).

The term "over a (the) substrate" used herein is not limited to a case where a component is directly formed on a (the) substrate, and includes a case where a component is formed over a (the) substrate with a predetermined layer interposed in between.

With this method, the electrode is obtained by forming the initial crystal nuclei of the electrode material over the substrate, and causing the initial crystal nuclei to be grown to form the grown layers. Since the substrate temperature when forming the initial crystal nuclei is higher than the substrate temperature when forming the grown layers, the initial crystal nuclei have excellent crystallinity. The grown layers are composed of a crystal having few grain boundaries and having excellent flatness, since the grown layers are formed at a substrate temperature lower than the substrate temperature when forming the initial crystal nuclei. Moreover, the grown layers can be formed while maintaining excellent crystallinity of the initial crystal nuclei. Therefore, according to this manufacturing method, an electrode having few grain boundaries and having excellent crystallinity and flatness can be obtained.

With this method, the electrode may be formed so that the initial crystal nuclei are formed to include crystal nuclei of a plurality of different electrode materials, or may be formed so that the initial crystal nuclei and the grown layers are formed of different electrode materials.

(2) In the method of manufacturing an electrode, the substrate temperature in the step (a) may be set at a temperature from 200° C. to 600° C., and the substrate temperature in the step (b) may be set at a temperature lower than 200° C.

(3) According to another embodiment of the present invention, there is provided a method of manufacturing an electrode over a substrate, the method comprising:

(a) forming initial crystal nuclei of an electrode material over the substrate in an island pattern; and (b) forming grown layers of the electrode material by causing the initial crystal nuclei to be grown, wherein energy of particles of the electrode material when forming the initial crystal nuclei is higher than energy of the particles of the electrode material when forming the grown layers.

With this method, since the energy of the particles of the electrode material when forming the initial crystal nuclei is higher than the energy of the particles of the electrode material when forming the grown layers, the resulting initial crystal nuclei have excellent crystallinity. Since the grown layers are formed so that the energy of the particles of the electrode material is reduced while maintaining crystallinity of the initial crystal nuclei, the grown layers are composed of a crystal having few grain boundaries and having excellent flatness. Therefore, according to this manufacturing method, an electrode having few grain boundaries and having excellent crystallinity and flatness can be obtained.

With this method, the electrode may be formed so that the initial crystal nuclei are formed to include crystal nuclei of a plurality of different electrode materials, or may be formed so that the initial crystal nuclei and the grown layers are formed of different electrode materials.

(4) In the method of manufacturing an electrode, the initial crystal nuclei may be formed by using a sputtering method, and the grown layers may be formed by using an evaporation method.

According to this method, the initial crystal nuclei are formed by using the sputtering method. A film having high adhesion and excellent crystallinity is generally obtained by using the sputtering method. However, the internal stress in the resulting film is high. According to this method, the grown layers are formed by causing the initial crystal nuclei to be grown by using the evaporation method while maintaining crystallinity of the initial crystal nuclei. In the evaporation method, since energy of particles of a material during forming a film is low and the grown layers can be formed in an atmosphere in which the amount of impurities is small, a clean film can be obtained and the internal stress in the resulting film can be reduced.

Therefore, with this method, a clean electrode containing few impurities as well as having excellent crystallinity can be obtained, in comparison with a case of using only the sputtering method through the entire process of forming a film. Moreover, with this configuration, an electrode with little strain in which the internal stress is reduced can be obtained.

(5) In the method of manufacturing an electrode, a plurality of the electrodes may be stacked by repeatedly performing the steps (a) and (b) a plurality of times.

With this method, an electrode in which a plurality of the electrodes having few grain boundaries are stacked can be obtained. Therefore, diffusion of constituent elements of a crystal layer adjacent to the electrode into the electrode at a boundary between the electrode and the crystal layer can be effectively reduced, for example.

(6) The method of manufacturing an electrode may further comprise performing heat treatment after the step (b).

With this method, the internal stress in the electrode can be released by performing the heat treatment, whereby strain in the electrode can be reduced. Oxidization of a surface of the electrode can be reduced by performing the heat treatment in a non-oxidizing atmosphere such as nitrogen or argon.

(7) In the method of manufacturing an electrode, the electrode material may be at least one of Pt, Ir, Ru, Cu, Ag, $IrO_2$, $RuO_2$, TiN, TaN, and $PbPt_3$.

(8) The method of manufacturing an electrode may further comprise filling at least gaps at grain boundaries of the grown layers with an electrode material for reducing diffusion after the step (b).

With this method, diffusion of a constituent material of a crystal layer adjacent to the electrode into the electrode can be effectively reduced by filling the grain boundaries of the grown layers, whereby deterioration of the electrode can be reduced.

As the electrode material for reducing diffusion, one of Ir, $IrO_2$, Ru, $RuO_2$, $HfO_2$, and $Al_2O_3$ can be employed.

(9) The electrode obtained by one of the above described methods can be applied to a ferroelectric memory or a semiconductor device comprising the ferroelectric memory.

In the ferroelectric memory and the semiconductor device, since the electrode having few grain boundaries and having excellent crystallinity is used, a constituent element of the ferroelectric does not easily diffuse into the electrode at a boundary between a ferroelectric film and the electrode. Therefore, a ferroelectric memory and a semiconductor device having excellent characteristics can be obtained.

Embodiments of the present invention are described below in detail with reference to the drawings.

1. Method of Manufacturing First Electrode

FIGS. 1A to 1D are views schematically showing manufacturing steps of a first electrode according to the present embodiment.

Figure 1A:
FIGS. 1A to 1D are cross-sectional views schematically showing a method of manufacturing a first electrode.

(1) As shown in FIG. 1A, a substrate 10 for forming an electrode is provided.

In the present embodiment, a semiconductor substrate made of an element semiconductor such as silicon or germanium or a compound semiconductor such as GaAs or ZnSe, a metal substrate made of Pt or the like, an insulating substrate such as a sapphire substrate, an MgO substrate, $SrTiO_3$, $BaTiO_3$, or a glass substrate, or the like may be used as the substrate 10. A substrate in which a layer such as an insulating layer is stacked on the above described substrate may be used as the substrate 10.

In the present embodiment, a metal such as Pt, Ir, Ru, Au, Ag, Al, or Cu, an oxide conductor such as $IrO_2$ or $RuO_2$, a nitride conductor such as TiN and TaN, or the like may be used as the electrode material.

Figure 1B:
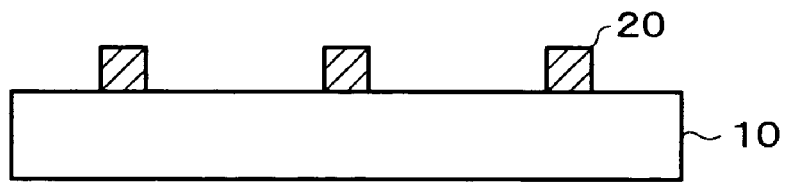

(2) As shown in FIG. 1B, initial crystal nuclei 20 of the electrode material are formed over the substrate 10 in an island pattern by using a sputtering method, for example. The temperature of the substrate 10 may be set at a temperature from 200° C. to 600° C. This improves the crystal quality of the initial crystal nuclei 20.

The sputtering method is a method in which a film is formed by causing ions to collide against a target material of a raw material under vacuum, and causing atoms removed from the target material to adhere to the substrate placed near the target material. Specifically, the sputtering method utilizes a sputtering phenomenon in which the electrode material is removed from the electrode by ion bombardment during discharging and adheres to the surface of an object placed near the electrode. In the present embodiment, an RF sputtering method, a DC sputtering method, a magnetron sputtering method, an ion beam sputtering method, or the like may be used depending on the ion formation method.

Figure 1C:
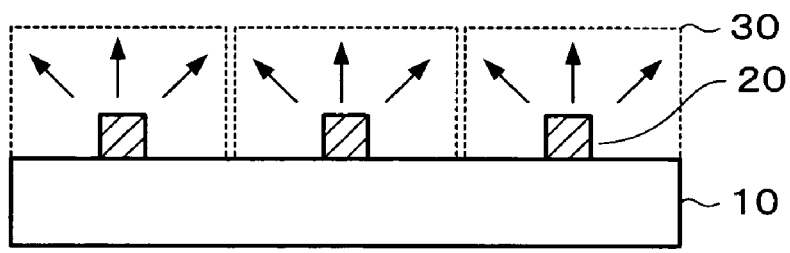

(3) As shown in FIG. 1C, the initial crystal nuclei 20 are grown by using a vacuum evaporation method or the like to form a grown layers 30. The grown layers 30 are formed while maintaining crystallinity of the initial crystal nuclei 20. The temperature of the substrate 10 is desirably lower than the temperature of the substrate 10 when forming the initial crystal nuclei 20. In more detail, the temperature of the substrate 10 may be set at a temperature lower than 200° C. This enables a plate-like crystal having few grain boundaries and having excellent flatness to be formed as the grown layers 30.

The vacuum evaporation method is a method in which a film is formed by causing the raw material substance to vaporize under vacuum by heating the raw material substance, and causing the vaporized raw material substance to condense on the surface of the formation target. Electron beams are generally used to apply vaporization heat to the substance. The raw material substance vaporized due to the application of vaporization heat releases the vaporization heat to condense on the surface of the formation target, whereby a film is formed. In the vacuum evaporation method, since the above-described step is performed under vacuum, the raw material substance can be easily vaporized. Moreover, deterioration caused by oxidation can be reduced, and the surface of the resulting film can be kept clean. In the vacuum evaporation method, since the atoms do not have a large amount of energy when forming a film in comparison with the sputtering method, the internal stress in the resulting film occurs to only a small extent.

Figure 1D:
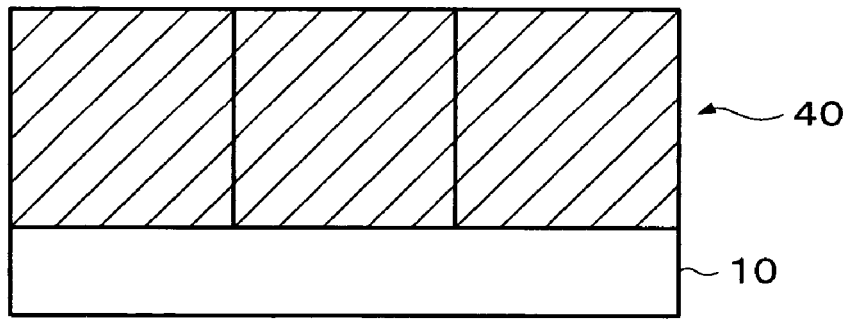

(4) As shown in FIG. 1D, an electrode 40 is formed over the substrate 10. The thickness of the electrode 40 may be 50 to 200 nm, for example. The electrode 40 has excellent crystallinity of the initial crystal nuclei 20 formed by using the sputtering method, a reduced number of grain boundaries and flatness of the grown layers 30 formed by using the vacuum evaporation method, and surface cleanliness. Specifically, according to the manufacturing method of the present embodiment, the electrode 40 having excellent crystallinity and flatness and having few grain boundaries can be obtained. Moreover, according to the manufacturing method of the present embodiment, the internal stress in the electrode 40 can be reduced by using the vacuum evaporation method to form the grown layers 30 in comparison with the case of using the sputtering method through the entire process of forming a film.

In the present embodiment, an intermediate layer such as an insulating layer or an adhesive layer may be formed between the electrode 40 and the substrate 10. The insulating layer may be formed of $SiO_2$, $Si_3N_4$, or the like. There are no specific limitations to the material for the adhesive layer insofar as the material can secure adhesion between the substrate 10 and the electrode 40 or between the insulating layer and the electrode 40. As examples of such a material, high-melting-point metals such as tantalum and titanium can be given. The intermediate layer may be formed by using various methods such as a thermal oxidation method, CVD method, sputtering method, vacuum evaporation method, or MOCVD method.

In the method of manufacturing a first electrode of the present embodiment, an electrode with reduced strain may be obtained by releasing the internal stress in the electrode 40 by performing a heat treatment after forming the electrode 40 by the above steps (1) to (4). Oxidization of the surface of the electrode can be reduced by performing the heat treatment in a non-oxidizing atmosphere such as nitrogen or argon.

In the present embodiment, in the case where an crystal layer is formed on the electrode, diffusion of constituent elements of the crystal layer into the electrode from the grain boundaries of the electrode, which causes the quality of the crystal layer to deteriorate, can be reduced by stacking electrodes having few grain boundaries by repeating the above steps (2) and (3). This feature may be achieved by steps shown in FIGS. 2A to 2C.

Figure 2A:
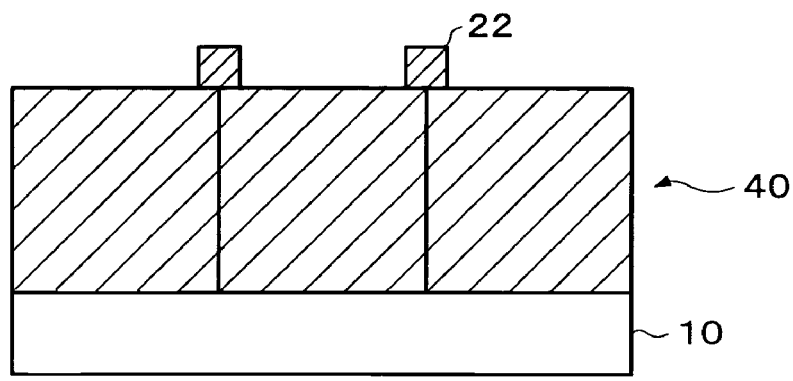
FIGS. 2A to 2C are cross-sectional views schematically showing a method of manufacturing a first electrode.

As shown in FIG. 2A, initial crystal nuclei 22 of the electrode material are formed in an island pattern on the electrode 40 formed by the above-described manufacturing steps by using the sputtering method, for example. The initial crystal nuclei 22 are formed on the electrode 40 at portions of which surface state is different from that of the other portions of the electrode 40, in particular, on gaps at the grain boundaries of the electrode 40.

Figure 2B:
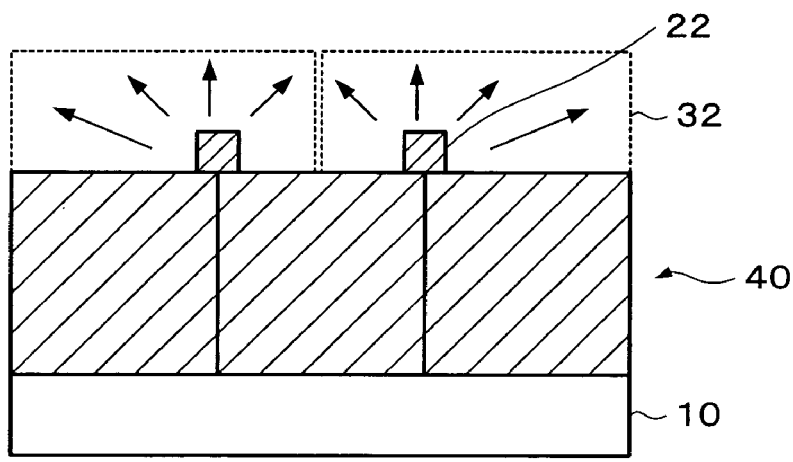
Figure 2C:
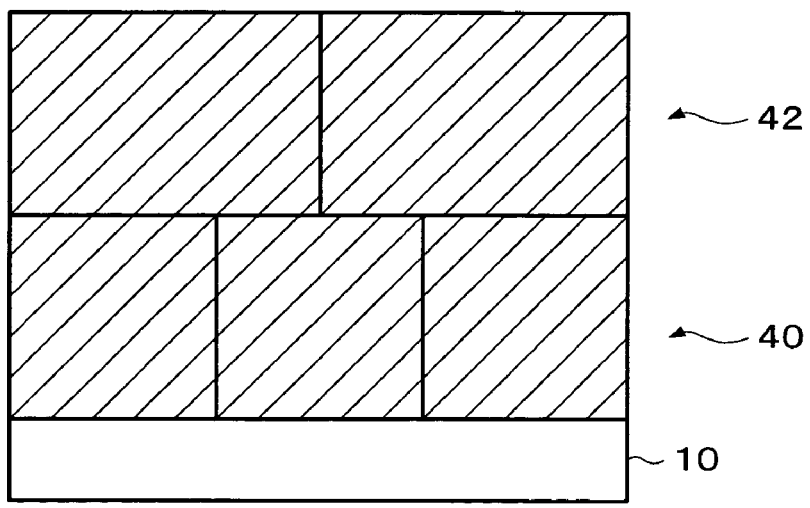

As shown in FIG. 2B, the initial crystal nuclei 22 are grown by using the vacuum evaporation method or the like to form a grown layers 32. The grown layers 32 are formed while maintaining crystallinity of the initial crystal nuclei 22. As shown in FIG. 2C, an electrode 42 is formed on the electrode 40. This enables an electrode to be obtained in which the electrodes 40 and 42 having few grain boundaries are stacked. Therefore, diffusion of constituent elements of a crystal layer adjacent to the electrode 42 into the electrodes 40 and 42 can be effectively reduced at a boundary between the electrode 42 and the crystal layer, for example.

In this feature, three or more electrodes may be stacked by repeating the steps (2) and (3).

EXAMPLE

An example of the method of manufacturing a first electrode of the present embodiment is described below with reference to the drawing.

Figure 3:
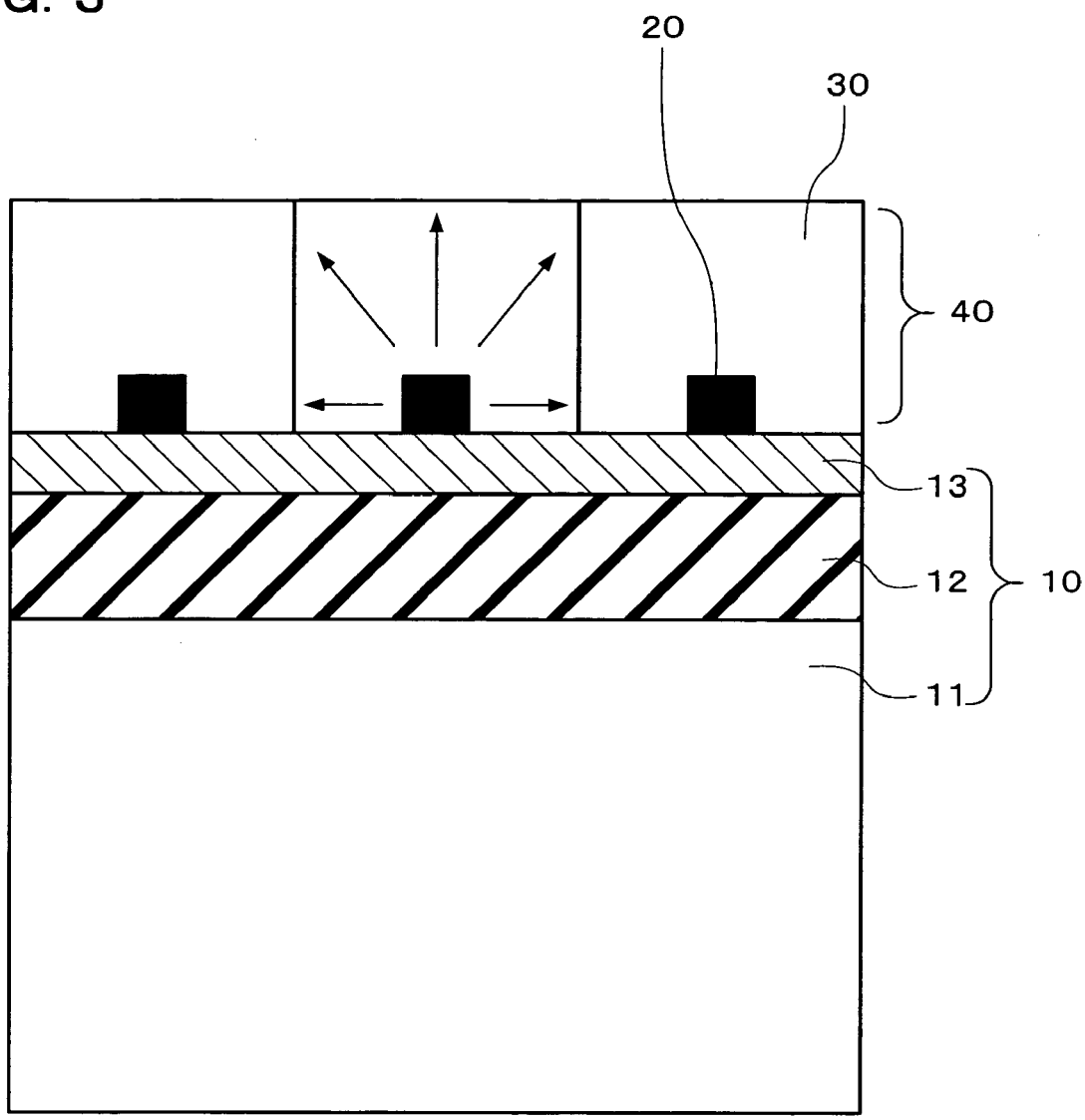
FIG. 3 is a cross-sectional view schematically showing an electrode according to an example of a method of manufacturing a first electrode.

In this example, Pt initial crystal nuclei 20 were formed in an island pattern by using the sputtering method. Pt grown layers 30 were formed by causing Pt to be grown by using the evaporation method to obtain a Pt electrode 40 as shown in FIG. 3. In the case of forming the Pt initial crystal nuclei 20 by using the sputtering method, it is important to secure crystallinity of the Pt initial crystal nuclei 20 by heating the substrate 10. In the case of forming the Pt grown layers 30 by causing Pt to be grown by using the evaporation method, it is important to secure surface flatness and to reduce the number of grain boundaries by causing Pt to be grown at a low temperature of 200° C. or less.

In this example, the Pt initial crystal nuclei 20 were formed by using an ion beam sputtering method. The ion beam sputtering method excels in controllability, since ions are independently generated at a distance from the target material. Therefore, since the target material or the substrate is not directly exposed to ion plasma, a film can be formed comparatively cleanly.

In this example, the vacuum evaporation method was used as the evaporation method when forming the Pt grown layers 30. In the vacuum evaporation method, since the above-described step is performed under vacuum, the raw material substance can be easily vaporized. Moreover, deterioration caused by oxidation can be reduced, and the surface of the substrate on which the film is formed can be kept clean. Furthermore, the vacuum evaporation method has an advantage in that an internal stress rarely occurs in the resulting film, since the atoms do not have a large amount of energy in comparison with the sputtering method.

In this example, as shown in FIG. 3, a substrate in which a silicon thermal oxide film 12 with a thickness of 200 nm was formed as an interlayer dielectric on the surface of an n-type silicon substrate 11 and a $TiO_X$ film 13 with a thickness of 20 nm was formed as an adhesive layer on the silicon thermal oxide film 12 was used as the substrate 10.

The Pt electrode 40 according to the present invention (Pt1, Pt2, and Pt3) with a thickness of 200 nm as shown in FIG. 3 was formed on the $TiO_X$/$SiO_2$/Si stacked substrate 10 under conditions shown in Table 1.

TABLE 1

| Specimen No. | | Pt electrode of present invention | | |
| --- | --- | --- | --- | --- |
| | | Pt1 | Pt2 | Pt3 |
| Sputtering condition | | | | |
| Degree of vacuum | Torr | $2.2 \times 10^{-6}$ | $2.2 \times 10^{-6}$ | $2.2 \times 10^{6}$ |
| Substrate temperature | ° C. | 200 | 400 | 600 |
| Deposition pressure | Pa | 0.4 | 0.4 | 0.4 |
| Ar gas | sccm | 20 | 20 | 20 |

TABLE 1-continued

| Specimen No. | | Pt electrode of present invention | | |
| --- | --- | --- | --- | --- |
| | | Pt1 | Pt2 | Pt3 |
| DC power | W | 100 | 100 | 100 |
| Voltage | V | 416 | 418 | 427 |
| Current | A | 0.23 | 0.23 | 0.23 |
| Thickness of initial nucleus layer | nm | 20 | 20 | 20 |
| Evaporation condition | | | | |
| Degree of vacuum | Torr | $7.5 \times 10^{-6}$ | $7.5 \times 10^{-6}$ | $7.5 \times 10^{-6}$ |
| Deposition pressure | Torr | $3.3 \times 10^{-6}$ | $3.3 \times 10^{-6}$ | $3.3 \times 10^{-6}$ |
| Substrate temperature | ° C. | 150 | 150 | 150 |
| Voltage | kV | 10 | 10 | 10 |
| Current | mA | 240 | 240 | 250 |
| Pt total thickness | nm | 200 | 200 | 200 |

As a comparative example, a Pt electrode 100 (Pt4, Pt5, Pt6, and Pt7) formed by using the conventional sputtering method as shown in FIG. 20 was provided under conditions shown in Table 2.

TABLE 2

| Specimen No. | | Comparative Example (Pt electrode formed by sputtering) | | | |
| --- | --- | --- | --- | --- | --- |
| | | Pt4 | Pt5 | Pt6 | Pt7 |
| Sputtering condition | | | | | |
| Degree of vacuum | Torr | $2.2 \times 10^{-6}$ | $2.2 \times 10^{-6}$ | $2.2 \times 10^{-6}$ | $2.2 \times 10^{-6}$ |
| Substrate temperature | ° C. | Room temperature | 250 | 400 | 600 |
| Deposition pressure | Pa | 0.4 | 0.4 | 0.4 | 0.4 |
| Ar gas | sccm | 20 | 20 | 20 | 20 |
| DC power | W | 100 | 100 | 100 | 100 |
| Voltage | V | 416 | 418 | 418 | 423 |
| Current | A | 0.23 | 0.23 | 0.23 | 0.23 |
| Pt film thickness | nm | 200 | 200 | 200 | 200 |

Figure 4:
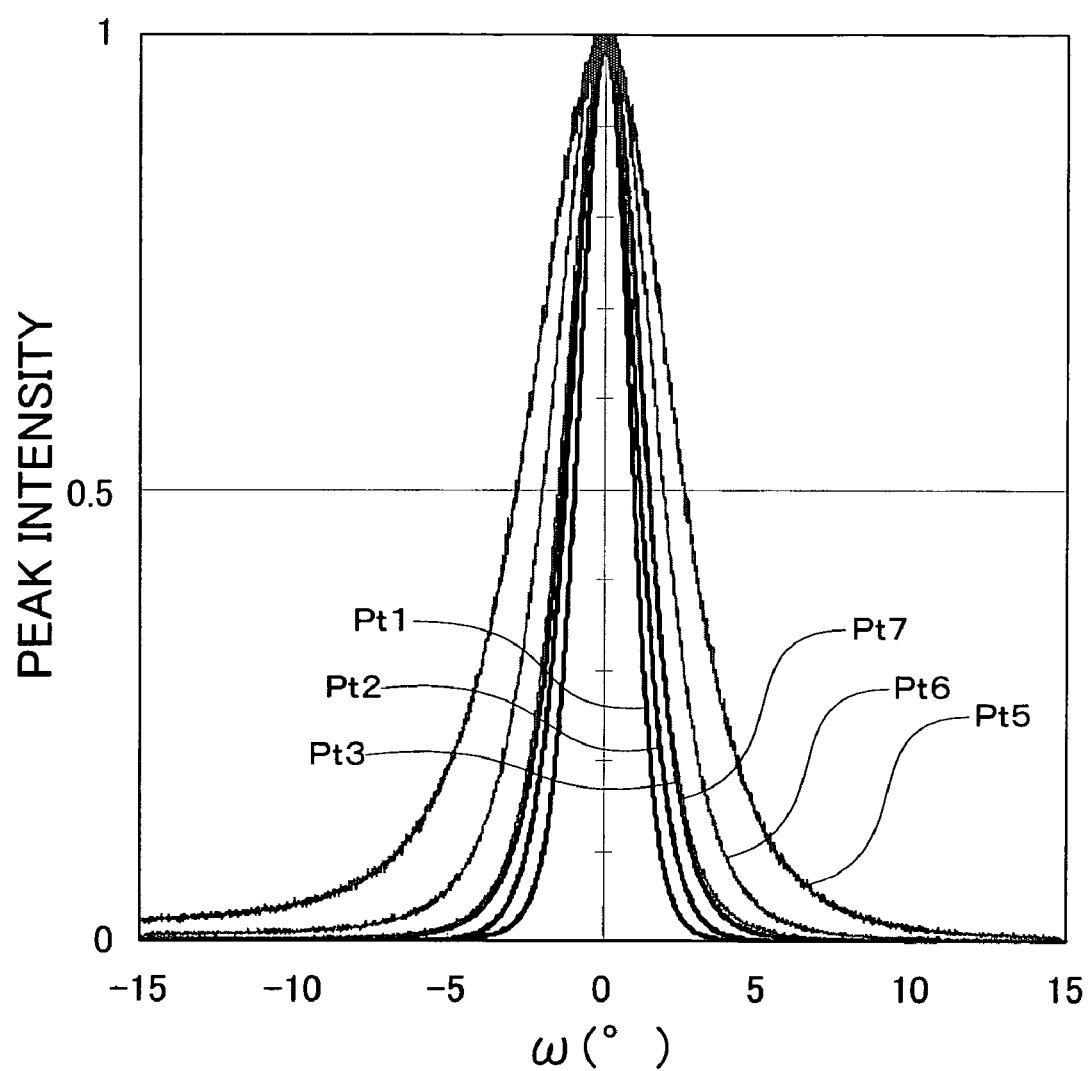
FIG. 4 is a graph showing analysis results for an electrode according to an example of a method of manufacturing a first electrode.
Figure 5A:
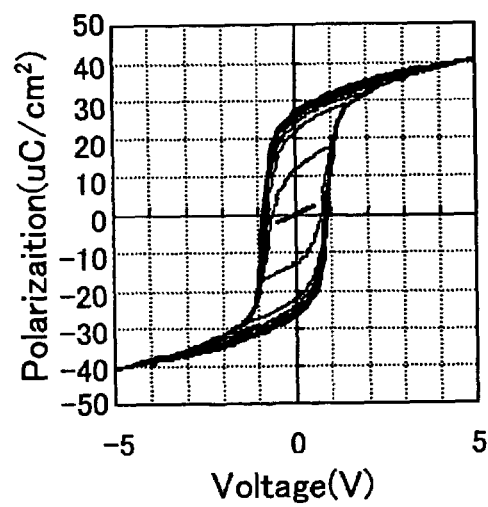
FIGS. 5A to 5D are graphs showing hysteresis characteristics of a ferroelectric film formed on an electrode according to an example of a method of manufacturing a first electrode.
Figure 5B:
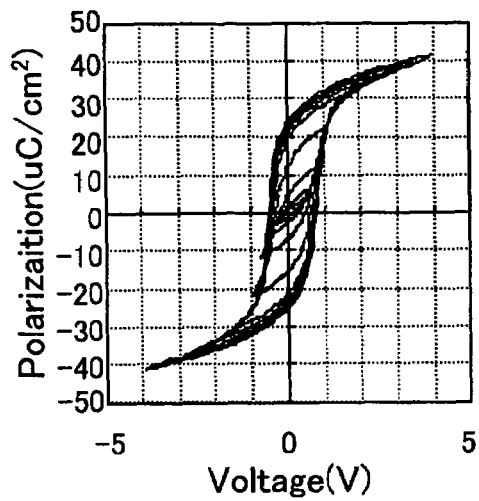
Figure 5C:
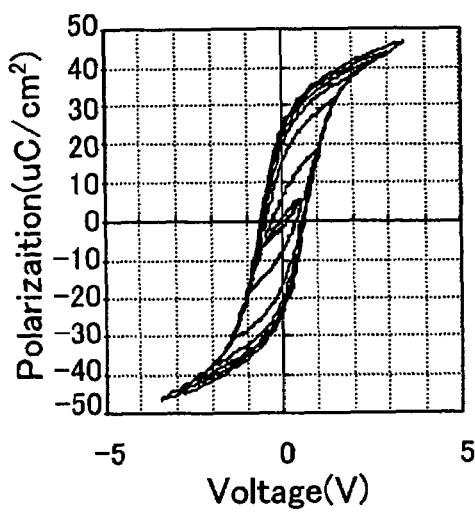
Figure 5D:
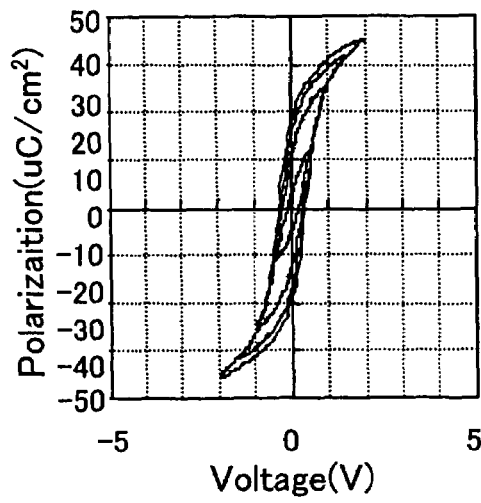

FIG. 4 shows measurement results for rocking curves of the Pt electrodes 40 (Pt1 to Pt3) and the Pt electrodes 100 (Pt5 to Pt7). The full widths at half maximum (FWHM) of Pt1, Pt2, and Pt3 formed by applying the manufacturing method of the present invention were respectively 1.80°, 2.46°, and 2.70°. On the contrary, the full widths at half maximum (FWHM) of Pt5, Pt6, and Pt7 formed by using the conventional sputtering method were respectively 3.00°, 4.02°, and 5.72°. Therefore, it was found that the Pt electrode 40 formed by applying the manufacturing method of the present invention excelled in both crystallinity and orientation.

The reason therefor is considered to be as follow. In the conventional manufacturing method using only the sputtering method, the substrate on which the Pt film is formed must be maintained at high temperature, and the substrate is exposed to high energy Ar plasma. Therefore, the substrate and the Pt film applied to the substrate are damaged, whereby the orientation deteriorates.

A PZT (Pb(Zr,Ti)$O_3$) film with a thickness of 15 to 100 nm was formed as a ferroelectric film on each of the Pt1 and Pt4 electrodes by using a sol-gel method. In the case of using Pt1 formed by applying the manufacturing method of the present invention, excellent ferroelectric characteristics as shown in FIGS. 5A to 5D were obtained. However, in the case of using Pt4 formed by using only the sputtering method, ferroelectric characteristics could not be obtained under conditions in which the thickness of PZT was 100 nm or less.

Figure 6A:
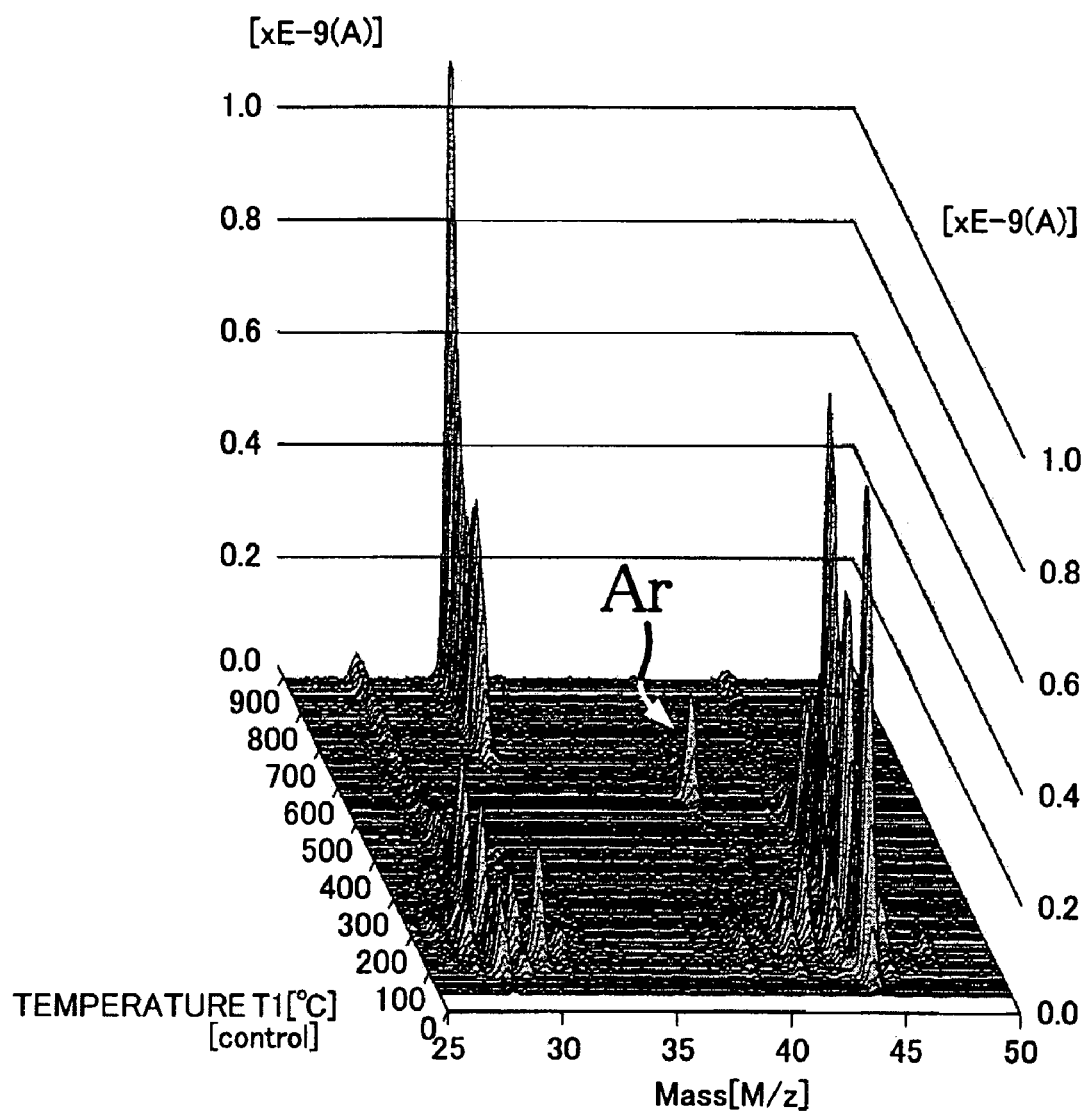
FIG. 6A is a graph showing degassing analysis results for a ferroelectric film formed on an electrode according to an example of a method of manufacturing a first electrode.
Figure 6B:
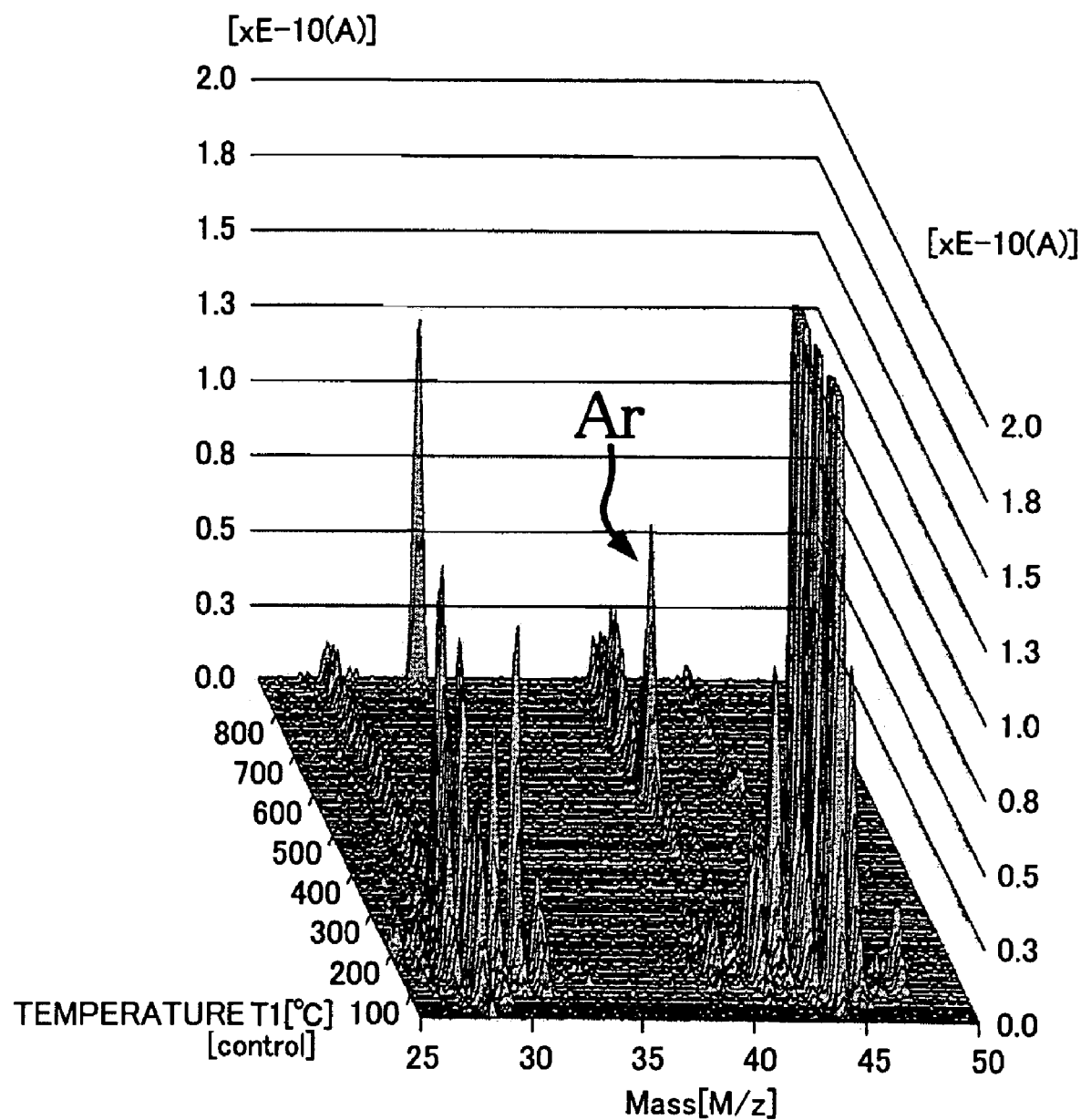
FIG. 6B is a graph showing degassing analysis results for a ferroelectric film formed on an electrode according to a comparative example using only a sputtering method.

The formation of the PZT film on Pt4 and Pt6 was terminated in the presintering stage before crystallization, and degassing analysis was conducted. As a result, it was found that a large amount of Ar gas was released from the Pt electrode 100 at about 600° C., as shown in FIGS. 6A and 6B. FIG. 6A shows analysis results in the case of using Pt4. FIG. 6B shows analysis results in the case of using Pt6.

The analysis results shown in FIGS. 6A and 6B are discussed below. The Ar gas was injected into the Pt electrode 100 during sputtering. Since the Ar gas is released to the boundary between the Pt electrode and the PZT film after or during crystallization of PZT, the boundary between the Pt electrode and the PZT film could not be maintained in a good state. As a result, the PZT film with a thickness of 100 nm or less could not exhibit ferroelectric characteristics on the Pt electrode 100 formed by using only the conventional sputtering method.

On the contrary, the Pt electrode 40 formed by applying the manufacturing method of the present invention excels in crystallinity and orientation. The Pt electrode 40 has a dense, flat, and smooth surface since the Pt electrode 40 is formed at low temperature. Moreover, the Pt electrode 40 has few grain boundaries which cause diffusion of the electrode material. Furthermore, since the grown layers 30 of the Pt electrode 40 are formed by using the evaporation method, the Pt electrode 40 does not contain impurities such as Ar. Therefore, excellent ferroelectric characteristics were obtained even if the PZT film with a thickness of 100 nm or less was formed on the Pt electrode 40 formed by applying the present invention.

In this example, the influence of the Pt electrode formed by applying the manufacturing method of the present invention on the lattice constant of the Pt crystal was examined. A platinum metal such as Pt is chemically stable and easily forms a (111) highly oriented film. Therefore, the platinum metal is known as a useful material as the electrode material for the ferroelectric memory and the like. However, the Pt electrode does not have sufficient lattice matching with the PZT ferroelectric film which makes up the capacitor of the ferroelectric memory. Such a lattice mismatching influences interfacial characteristics of the capacitor. Therefore, it is considered to be important to improve lattice matching in order to improve characteristics of the capacitor.

The present inventors have examined usefulness of the Pt electrode formed by using the method of the present embodiment when applied to a ferroelectric capacitor or the like.

Figure 7A:
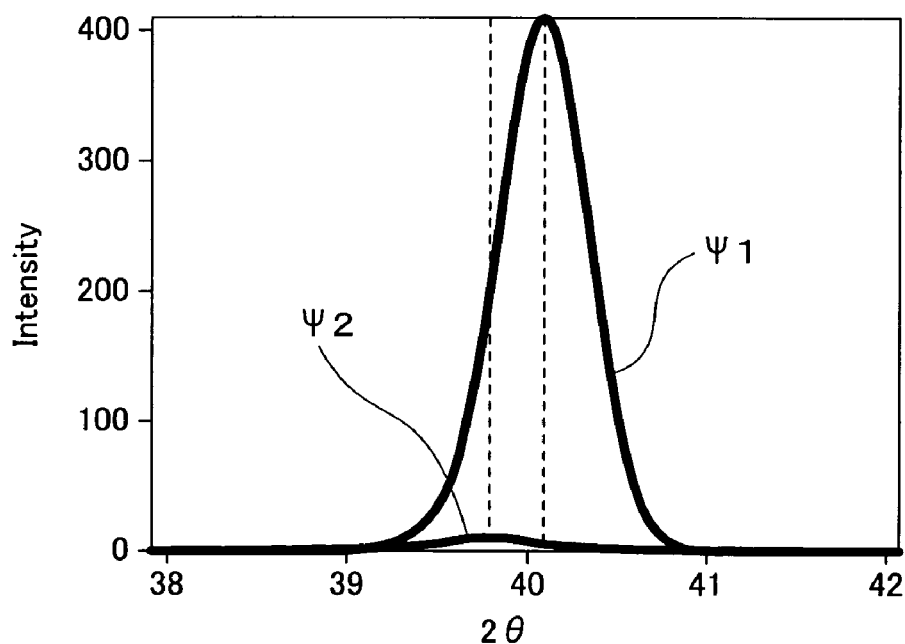
FIG. 7A is a graph showing X-ray diffraction analysis results for an electrode according to an example of a method of manufacturing a first electrode.
Figure 7B:
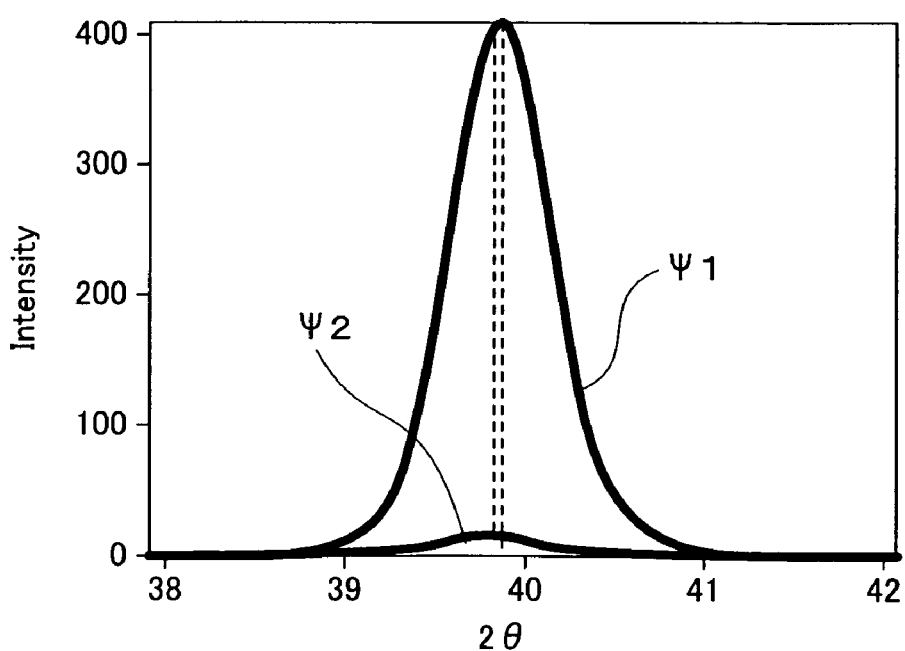
FIG. 7B is a graph showing X-ray diffraction analysis results for an electrode according to a comparative example using only a sputtering method.

FIG. 7A shows X-ray diffraction measurement results for a Pt electrode formed by using the sputtering method and the evaporation method according to the steps to form a film shown in FIG. 1. FIG. 7B shows X-ray diffraction measurement results for a Pt electrode formed by using only the conventional sputtering method. In the measurement of each Pt electrode, the measurement was conducted in the surface direction ($\psi 1$) and the cross-sectional direction ($\psi 2$) with respect to the Pt coated substrate.

As shown in FIG. 7A, in the Pt electrode formed by applying the method of the present embodiment, the peak obtained in the measurement of $\psi 2$ is shifted to the lower angle side with respect to the peak obtained in the measurement of $\psi 1$. The lattice constant was calculated and it was found that a=3.99, b=3.99 and c=3.92. Specifically, in the Pt electrode formed by applying the method of the present embodiment, the crystal lattice is compressed in the cross-sectional direction. In the Pt electrode formed by using only the sputtering method, the peak obtained in the measurement of $\psi 1$ appeared at the same position as the peak obtained in the measurement of $\psi 2$. The lattice constant was calculated and it was found that a=3.96, b=3.96, c=3.96. Specifically, the Pt electrode formed by using only the sputtering method has a crystal lattice close to the cube. It is considered that the difference in lattice constant occurs due to the difference in internal stress between Pt deposited by using only the sputtering method and Pt deposited by using the sputtering method and the evaporation method in combination.

The above results are compared with the lattice constant of a PZT crystal (a=4.02, b=4.02, c=4.11). The lattice mismatch rate is 2.52% in the case of forming a PZT film on the Pt electrode obtained by using the method of the present embodiment. On the other hand, the lattice mismatch rate is 4.08% in the case of forming a PZT film on the conventional Pt electrode. Therefore, it was found that the Pt electrode formed by the present embodiment can reduce lattice mismatch with the PZT ferroelectric film, and is suitable for application to devices such as a ferroelectric memory.

In the present embodiment, a highly pure crystal film can be obtained since the evaporation method is used. Moreover, since the evaporation method utilizes a large amount of energy when a gas changes into a solid, a crystal film having sufficiently high crystallinity and orientation is obtained. Therefore, an electrode having an improved quality can be formed with excellent reproducibility.

2. Method of Manufacturing Second Electrode

FIGS. 8A to 8D are views schematically showing manufacturing steps of a second electrode according to the present embodiment. The present embodiment illustrates the case where initial crystal nuclei of the electrode are formed of two or more different electrode materials.

Figure 8A:
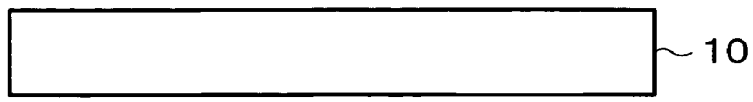
FIGS. 8A to 8E are cross-sectional views schematically showing a method of manufacturing a second electrode.

(1) In the present embodiment, the substrate 10 for forming an electrode is provided, as shown in FIG. 8A. As the material for the substrate 10, a material the same as the material used in the manufacturing method of the first electrode may be used.

Figure 8B:
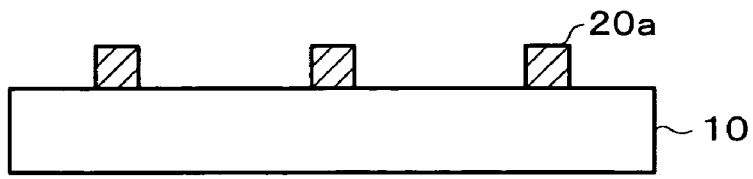

(2) As shown in FIG. 8B, first initial crystal nuclei 20*a* are formed of a first electrode material over the substrate 10 in an island pattern by using the sputtering method, for example. The temperature of the substrate 10 may be set at a temperature from 200° C. to 600° C. This improves the crystal quality of the first initial crystal nuclei 20*a* formed of the first electrode material. As the first electrode material, a metal such as Pt, Ir, Ru, Au, Ag, Al, or Cu, an oxide conductor such as $IrO_2$ or $RuO_2$, a nitride conductor such as TiN and TaN, or the like may be used.

Figure 8C:
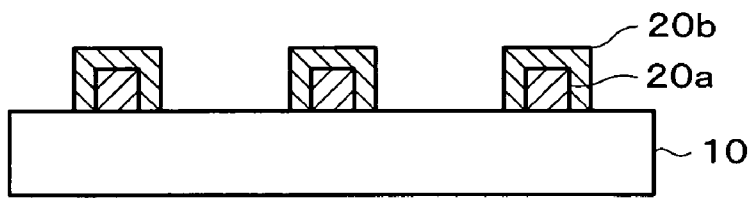

(3) As shown in FIG. 8C, second initial crystal nuclei 20*b* are formed of a second electrode material differing from the first electrode material on the first initial crystal nuclei 20*a* by using the sputtering method, for example. The temperature of the substrate 10 may be set at a temperature from 200° C. to 600° C. This improves the crystal quality of the second initial crystal nuclei 20*b* formed of the second electrode material. As the second electrode material, a metal such as Pt, Ir, Ru, Au, Ag, Al, or Cu, an oxide conductor such as $IrO_2$ or $RuO_2$, a nitride conductor such as TiN and TaN, or the like may be used.

Figure 8D:
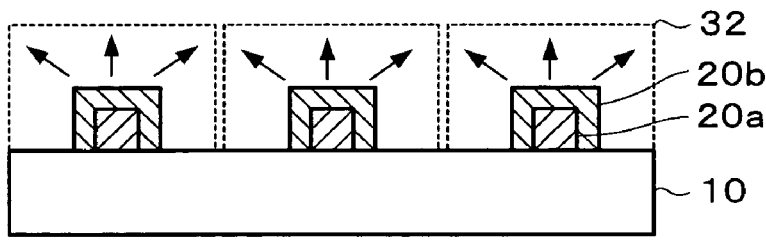

(4) As shown in FIG. 8D, the second initial crystal nuclei 20*b* are grown by using the vacuum evaporation method or the like to form the grown layers 32. The grown layers 32 are formed while maintaining crystallinity of the initial crystal nuclei 20*b*. The temperature of the substrate 10 is desirably lower than the temperature of the substrate 10 when forming the initial crystal nuclei 20a and 20b. In more detail, the temperature of the substrate 10 may be set at a temperature lower than 200° C. This enables a plate-like crystal having few grain boundaries and having excellent flatness to be formed as the grown layers 30.

Figure 8E:
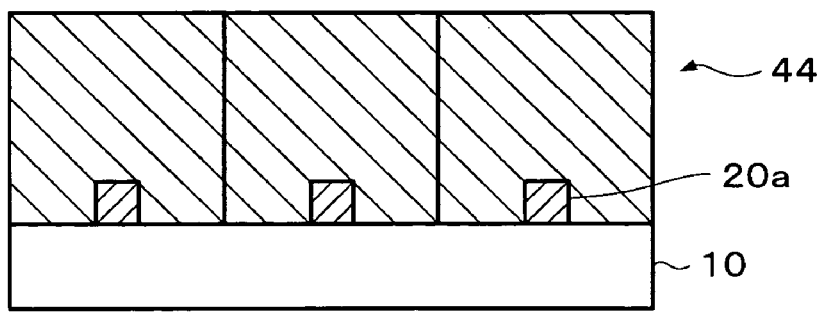

(5) As shown in FIG. 8E, an electrode 44 is formed over the substrate 10. The thickness of the electrode 44 may be 50 to 200 nm, for example. The electrode 44 has excellent crystallinity of the initial crystal nuclei 20b formed by using the sputtering method, a reduced number of grain boundaries and flatness of the grown layers 32 formed by using the vacuum evaporation method, and surface cleanliness. In the manufacturing method of the present embodiment, the electrode 44 having excellent crystallinity and flatness and having few grain boundaries can be obtained. In the manufacturing method of the present embodiment, the internal stress in the electrode 44 can be reduced by using the vacuum evaporation method to form the grown layers 32 in comparison with the case of using the sputtering method through the entire process of forming a film.

In the manufacturing method according to the present embodiment, an intermediate layer such as an insulating layer or an adhesive layer may be formed over the substrate 10 in the same manner as in the method of manufacturing a first electrode. In the manufacturing method of the present embodiment, an electrode with reduced strain may be obtained by releasing the internal stress in the electrode 44 by performing a heat treatment after forming the electrode 44. In the present embodiment, a structure in which a plurality of electrodes are stacked may be formed by repeatedly performing the steps (2) to (4).

EXAMPLE

An example of the method of manufacturing a second electrode of the present embodiment is described below with reference to the drawing.

In this example, Ir first initial crystal nuclei 20a and Pt second initial crystal nuclei 20b were formed in that order in an island pattern by using the ion beam sputtering method. Pt grown layers 32 were formed by using the vacuum evaporation method to obtain an Ir—Pt electrode 44 as shown in FIG. 9. Ir employed in this example as the material for the first initial crystal nuclei 20a is generally known as an electrode material which improves fatigue characteristics of a PZT ferroelectric capacitor. This means that Ir has a greater effect of reducing diffusion on the ferroelectric material in comparison with Pt which is also the platinum electrode material. Therefore, in the case where the electrode 44 is employed as the electrode of the ferroelectric capacitor, fatigue characteristics of the capacitor can be improved by allowing the material having a high effect of reducing diffusion on the ferroelectric material to be present in the electrode as the initial crystal nuclei 20a. In this example, as shown in FIG. 8, a substrate in which the silicon thermal oxide film 12 with a thickness of 200 nm was formed as an interlayer dielectric film on the surface of the n-type silicon substrate 11 and the $TiO_X$ film 13 with a thickness of 20 nm was formed as an adhesive layer on the silicon thermal oxide film 12 is used as the substrate 10.

Figure 10A:
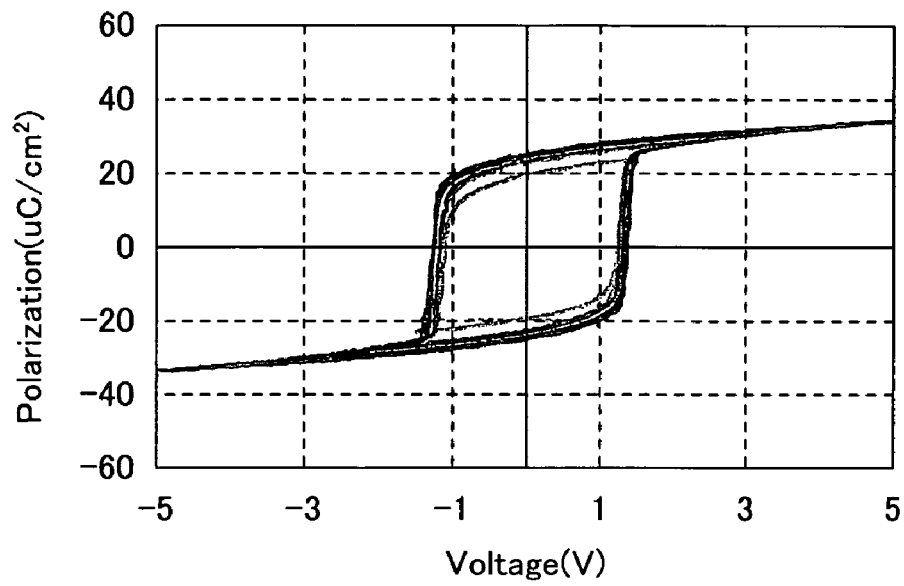
FIG. 10A is a graph showing hysteresis characteristics of a ferroelectric capacitor formed by using an electrode according to an example of a method of manufacturing a second electrode.
Figure 10B:
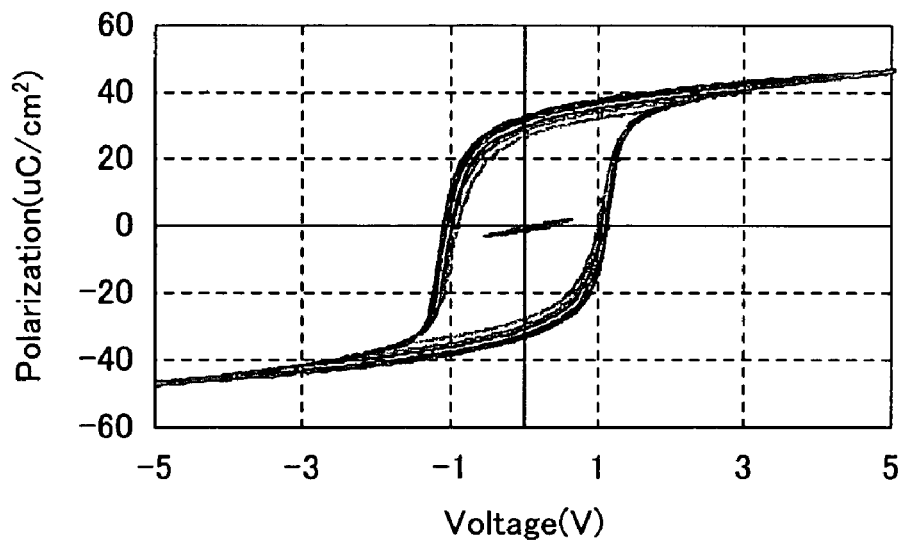
FIG. 10B is a graph showing hysteresis characteristics of a ferroelectric capacitor formed on an electrode according to a comparative example using only a sputtering method.
Figure 11A:
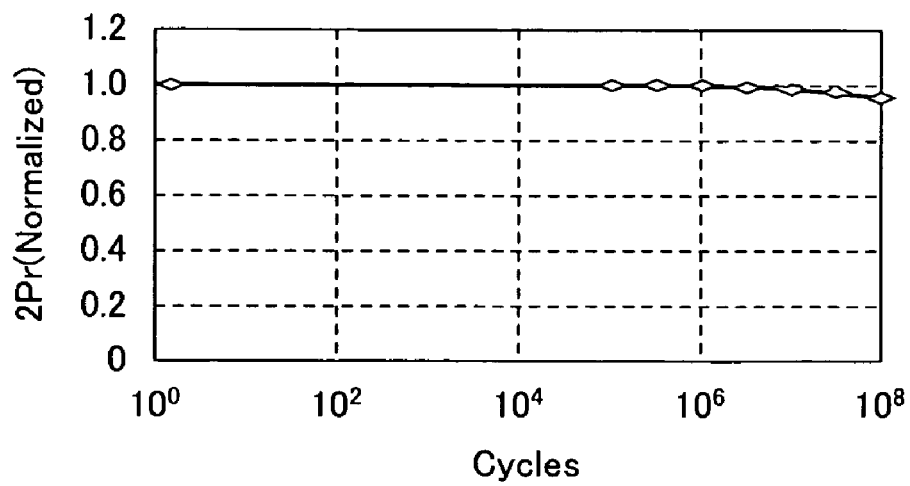
FIG. 11A is a graph showing fatigue characteristics of a ferroelectric capacitor formed by using an electrode according to an example of a method of manufacturing a second electrode.
Figure 11B:
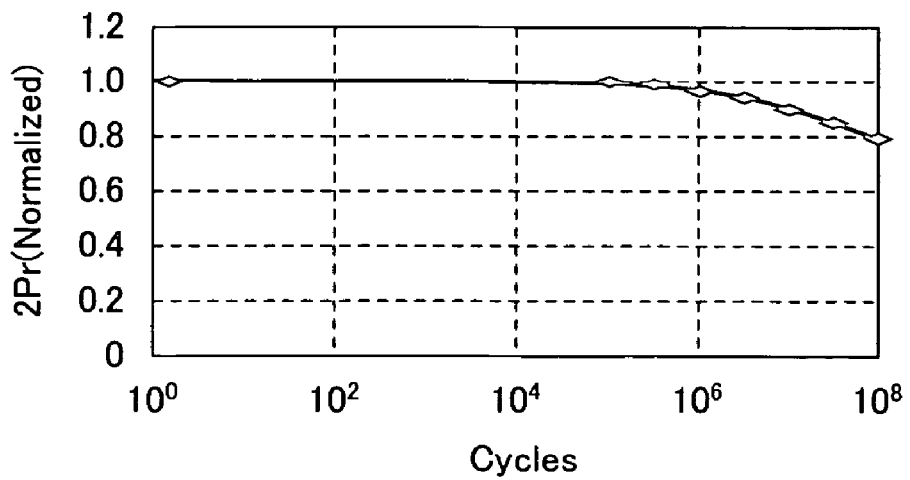
FIG. 11B is a graph showing fatigue characteristics of a ferroelectric capacitor formed on an electrode according to a comparative example using only a sputtering method.

FIG. 10A shows hysteresis characteristics of a ferroelectric capacitor including a PZT ferroelectric section formed on the Pt—Ir complex electrode 44 having the structure shown in FIG. 9. As a comparative example, FIG. 10B shows hysteresis characteristics of a ferroelectric capacitor including a PZT ferroelectric section formed on the Pt electrode 100 as shown in FIG. 20 which was formed by using only the sputtering method. As shown in FIGS. 10A and 10B, it was confirmed that the ferroelectric capacitor including the electrode 44 formed by applying this example had hysteresis characteristics with excellent squareness in comparison with the ferroelectric capacitor including the electrode 100 of the comparative example formed by using only the sputtering method. Fatigue characteristics of these two ferroelectric capacitors were measured. FIG. 11A shows the case of applying this example. FIG. 11B shows the comparative example in which only the sputtering method was used. As shown in FIGS. 11A and 11B, it was confirmed that the ferroelectric capacitor including the electrode 44 formed by applying this example excelled in fatigue characteristics.

In this example, examinations were made of the case where the Ir—Pt complex electrode was used as the upper electrode of the ferroelectric capacitor and the case where the Ir—Pt complex electrode was used as the upper electrode and the lower electrode of the ferroelectric capacitor.

An Si wafer 10 coated with the Pt electrode 100 as the lower electrode formed by using the conventional sputtering method was used as the substrate. A PZT film 50 with a thickness of 200 nm was formed on the Pt electrode 100 by using the sol-gel method.

Figure 12A:
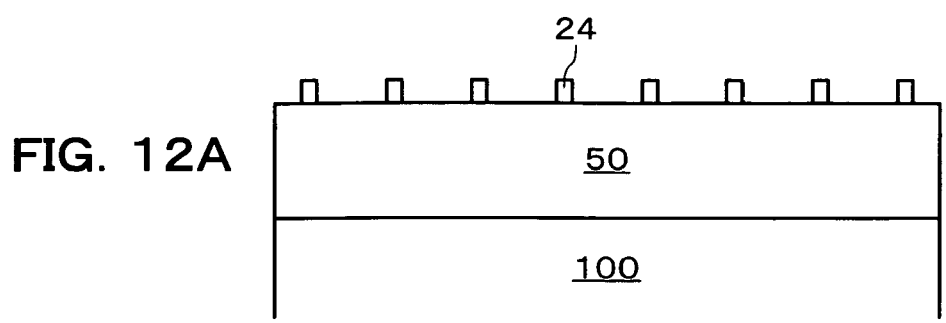
FIGS. 12A to 12D are cross-sectional views schematically showing an example of a method of manufacturing a second electrode.

As shown in FIG. 12A, the Pt electrode initial nuclei 20a with a thickness of 10 nm were formed on the PZT film 50 by using the sputtering method at a substrate temperature of 400° C. The Pt initial nuclei were not formed in the shape of a film, but formed in an island pattern. The conditions for forming a film were at a DC power of 100 W using a DC sputtering device, a deposition pressure of 0.3 Pa using Ar plasma, a substrate temperature of 400° C., a period of time of five seconds, and a thickness of 5 nm.

Figure 12B:
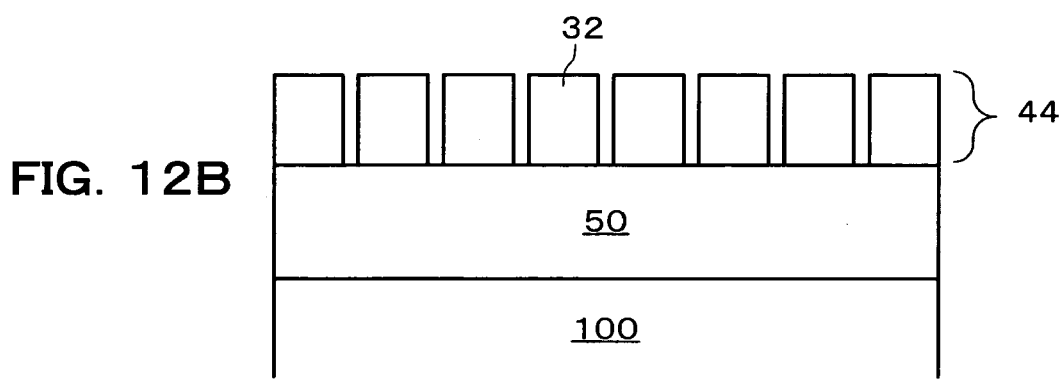

The Pt initial nuclei were grown by using the evaporation method at a substrate temperature of 200° C. until the PZT film 50 was completely and continuously covered with the Pt electrode to form first Pt grown layers 32, as shown in FIG. 12B. The first Pt electrode 44 was thus obtained. The total thickness of the first Pt electrode 44 was 40 nm. The conditions for forming a film were at a DC power of 100 W using a DC sputtering device, a deposition pressure of 0.3 Pa using Ar plasma, a substrate temperature of 200° C., a period of time of 60 seconds, and a total film thickness of 40 nm.

Post-annealing may be performed in an oxygen atmosphere in order to allow PZT to recover from deterioration of characteristics due to process damage during the formation of the first Pt electrode 44. In the case where the total thickness of the first Pt electrode 44 is as thin as about 40 nm, and the first Pt electrode 44 has a large number of gaps at the grain boundaries and allows oxygen to sufficiently pass therethrough as in this example, it is effective to perform post-annealing while supplying oxygen to the PZT film 50 through the gaps at the grain boundaries of the first Pt electrode 44.

Figure 12C:
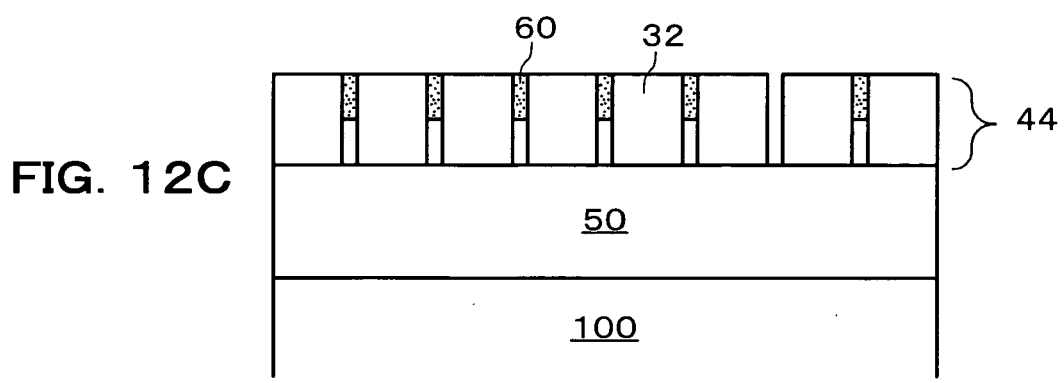

In this example, the minute gaps at the grain boundaries of the first Pt grown layers 32 of the first Pt electrode 44 were filled with Ir particles 60 for reducing diffusion by using the sputtering method under conditions for forming a film in which a film with a thickness of 10 nm was deposited on a flat substrate to form a structure shown in FIG. 12C. The substrate temperature may be arbitrarily set. The sputtering may be performed in an oxygen atmosphere. $IrO_2$ particles may be used to fill the gaps. This utilizes a phenomenon in which Ir or $IrO_2$ particles selectively enter the gaps between the Pt grain boundaries as described later.

Figure 12D:
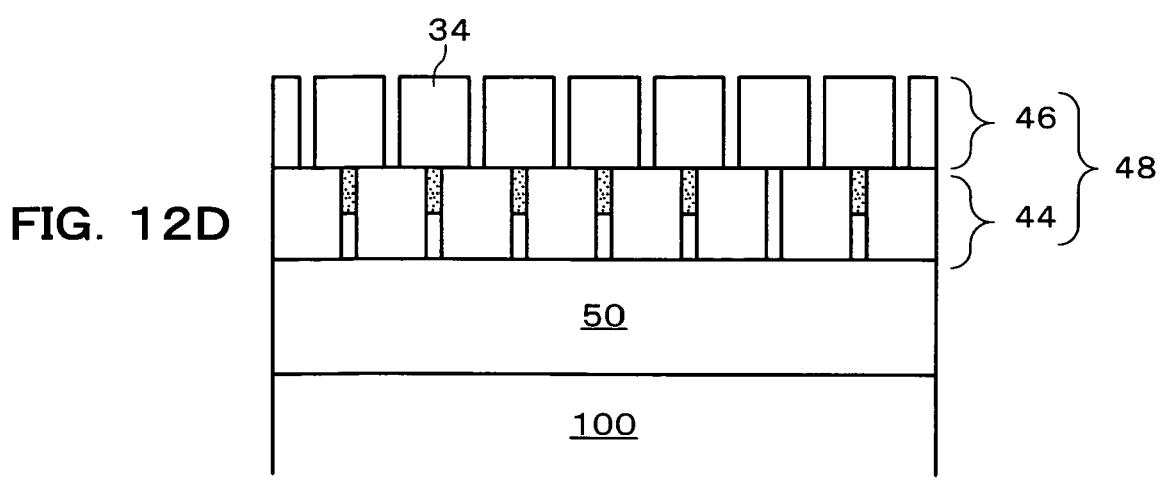

The second Pt grown layers 34 were grown to a desired thickness by using the depositing method to form the second Pt electrode 46. A structure including an Ir—Pt electrode 48 consisting of the first Pt electrode 44 and the second Pt electrode 46 as shown in FIG. 12D was formed. In this example, the Ir—Pt electrode 48 was formed to have a total thickness of 160 nm. The evaporation conditions were at a deposition pressure of $2.2 \times 10^{-6}$ Torr, an electron beam power of 2 kW, a deposition temperature of room temperature, a period of time of 10 minutes, and a total film thickness of 160 nm.

Figure 13:
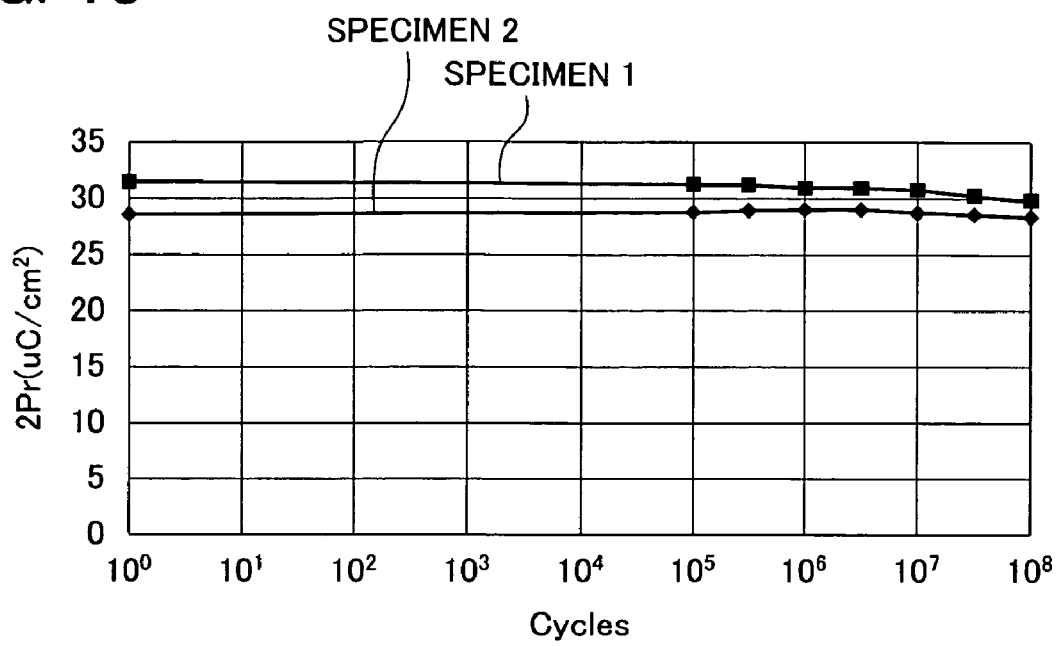
FIG. 13 is a graph showing fatigue characteristics of a ferroelectric capacitor formed on an electrode according to an example of a method of manufacturing a second electrode.

Fatigue characteristics of the PZT capacitor thus obtained were evaluated. As a result, the PZT capacitor exhibited excellent fatigue characteristics as shown in FIG. 13. In FIG. 13, a specimen 1 is a PZT capacitor in the case where Ir particles were used to reduce diffusion at grain boundaries, and a specimen 2 is a PZT capacitor in the case where $IrO_2$ particles were used to reduce diffusion at grain boundaries.

Figure 14:
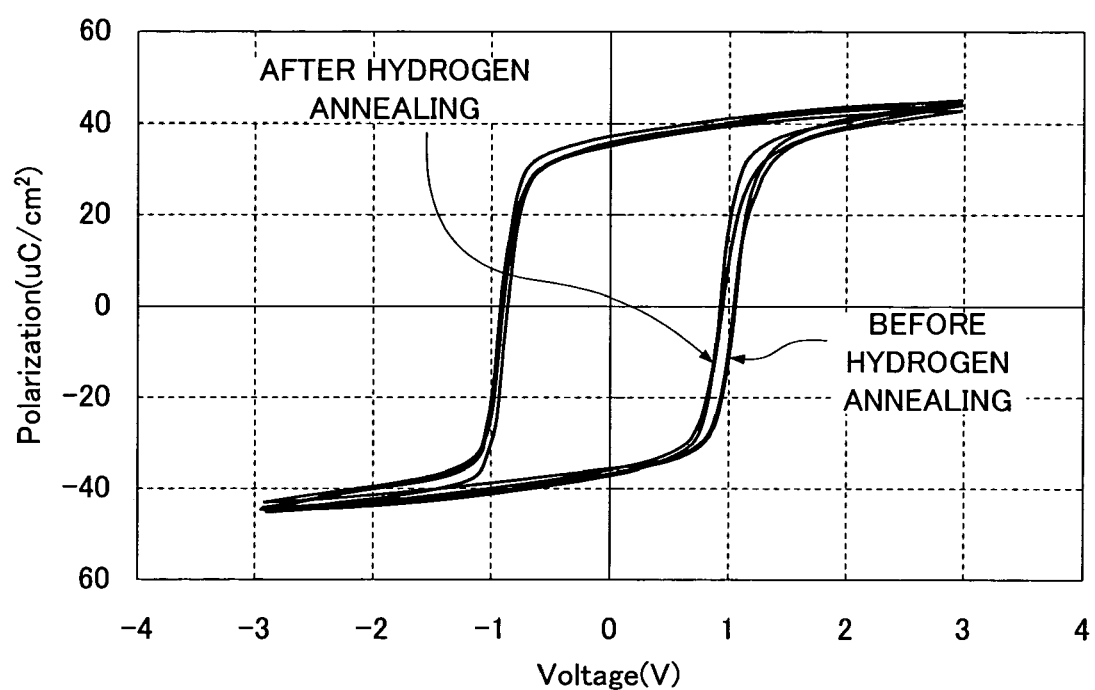
FIG. 14 is a graph showing hysteresis characteristics of a ferroelectric capacitor formed on an electrode according to an example of a method of manufacturing a second electrode.

The PZT capacitor of the specimen 2 was annealed at 400° C. for 30 minutes in a nitrogen atmosphere containing 5% hydrogen. As a result, no change in hysteresis characteristics was observed before and after the annealing treatment, as shown in FIG. 14.

Figure 15:
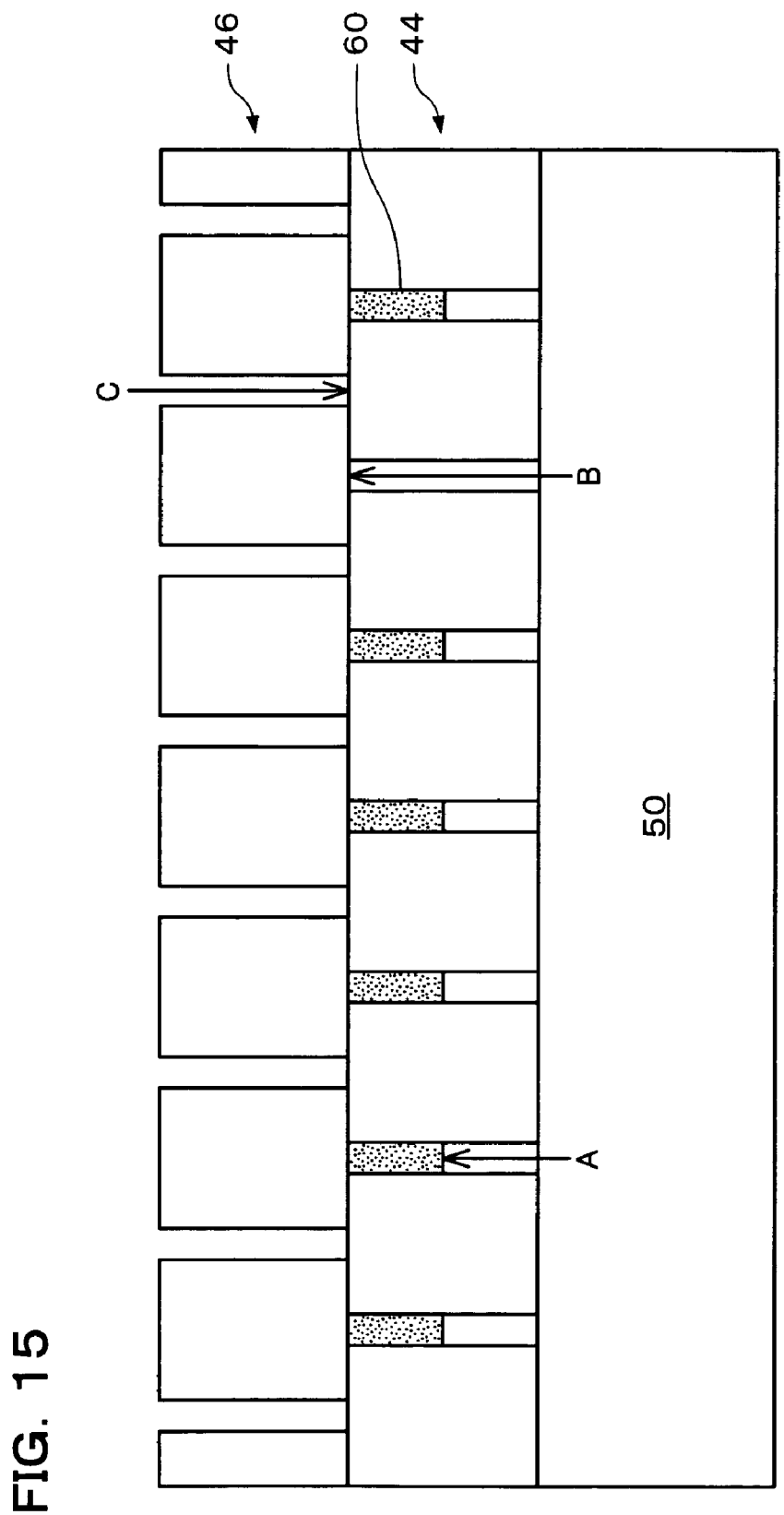
FIG. 15 is illustrative of a function of an electrode according to an example of a method of manufacturing a second electrode.
Figure 16A:
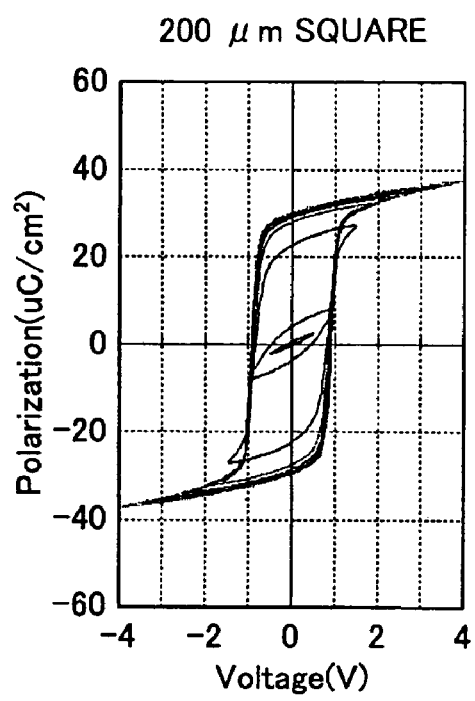
FIGS. 16A to 16D are graphs showing hysteresis characteristics of a ferroelectric capacitor using an electrode according to an example of a method of manufacturing a second electrode.
Figure 16B:
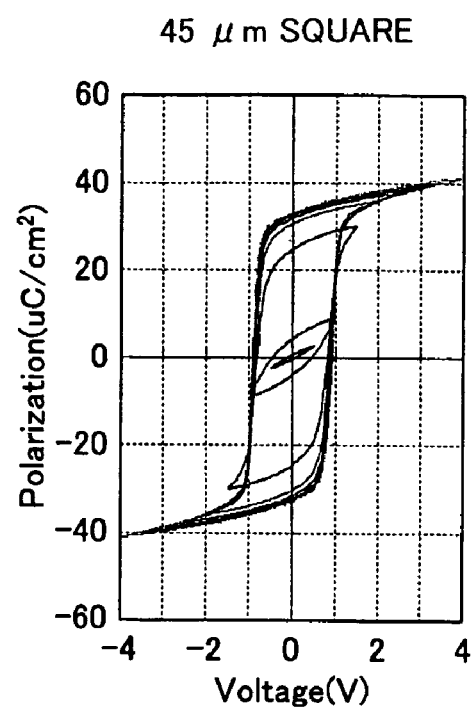
Figure 16C:
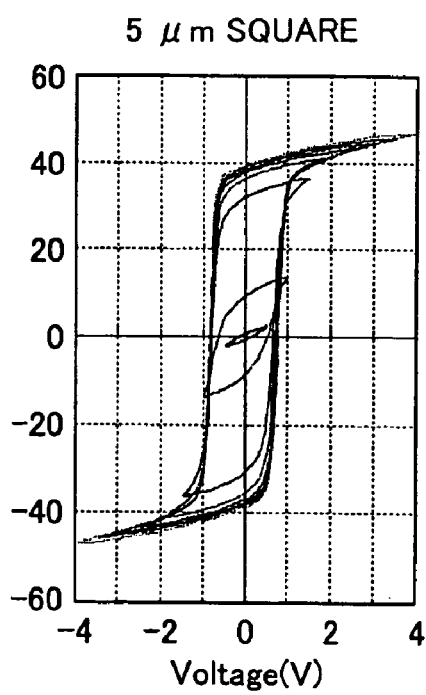
Figure 16D:
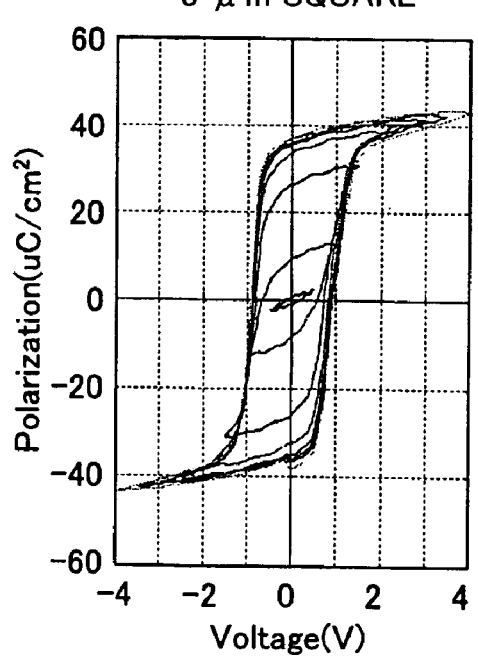

It is known that ferroelectrics such as PZT deteriorate in characteristics after annealing in a reducing atmosphere such as hydrogen. However, in the case of using the Ir—Pt electrode 48 of the present invention, deterioration of characteristics was observed to only a small extent, as shown in FIG. 14. This suggests that hydrogen entering PZT due to grain boundary diffusion causes deterioration of characteristics due to a large number of Pt grain boundaries, and that the present invention effectively reduce diffusion of hydrogen by plugging the Pt grain boundaries with a very small amount of Ir particles. Specifically, as indicated by the arrow A shown in FIG. 15, the Ir particles 60 have a function to block diffusion and effectively reduce diffusion of hydrogen from above or diffusion of the elements of PZT. Moreover, Pt is not continuously grown, specifically, the grain boundaries of Pt are not continuously formed by separately forming the first Pt electrode 44 and the second Pt electrode 46 as the electrode, and causing Ir as a foreign substance to be present between the electrodes. Therefore, as indicated by arrows B and C shown in FIG. 15, even the Pt grain boundary which the Ir particles 60 did not successfully enter has an effect of reducing diffusion. As a result, the PZT capacitor using the Ir—Pt electrode 48 of this example exhibited excellent ferroelectric characteristics.

In the Ir—Pt electrode 48 of the present invention, since the amount of Ir used is very small, expensive Ir can be effectively utilized. Moreover, since most of the electrode is formed of Pt which is softer than Ir, the etching process can be effectively used, whereby a minute capacitor can be easily formed.

Capacitors 200 μm square (200 μm×200 μm), 45 μm square (45 μm×45 μm), 5 μm square (5 μm×5 μm), and 3 μm square (3 μm×3 μm) were formed and subjected to evaluation of hysteresis characteristics. As shown in FIGS. 16A to 16D, it was confirmed that all the capacitors had excellent hysteresis characteristics.

Figure 17A:
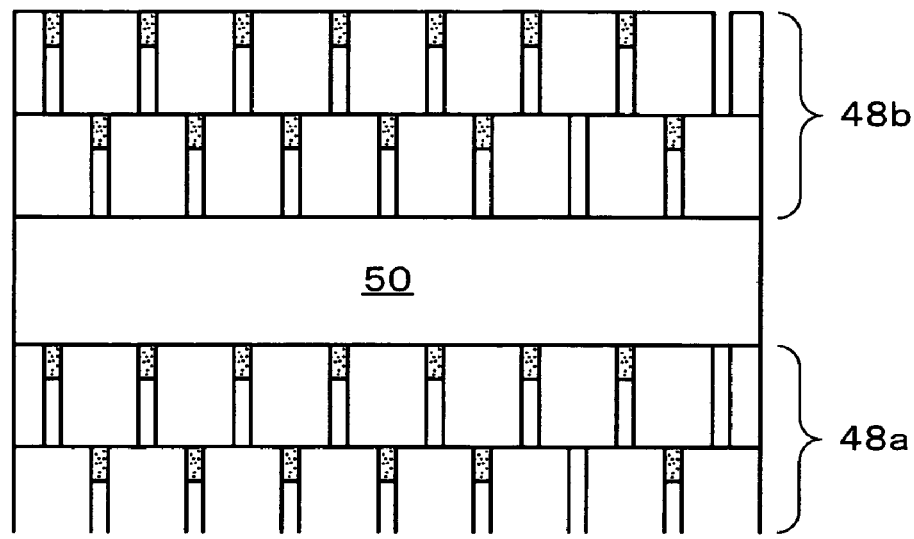
FIGS. 17A and 17B are illustrative of a structure of a ferroelectric capacitor including an electrode according to an example of a method of manufacturing a second electrode.
Figure 17B:
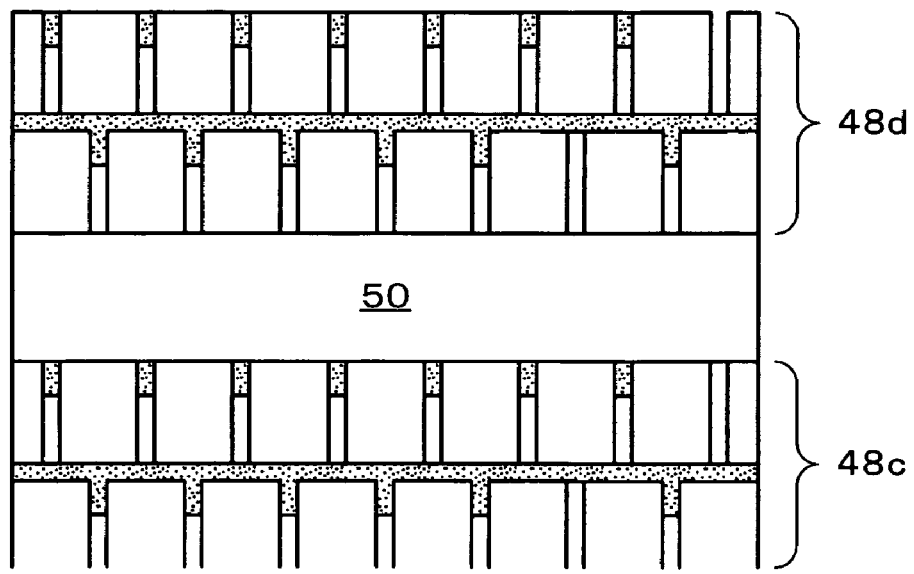

Interdiffusion between the Si substrate and the electrode can be reduced by using Ir—Pt complex electrodes 48a and 48b shown in FIG. 17A or Ir—Pt complex electrodes 48c and 48d shown in FIG. 17B formed by using the method of manufacturing the electrode of the present invention as the upper electrode and lower electrode of the PZT capacitor, whereby further excellent ferroelectric characteristics would be obtained.

Figure 18A:
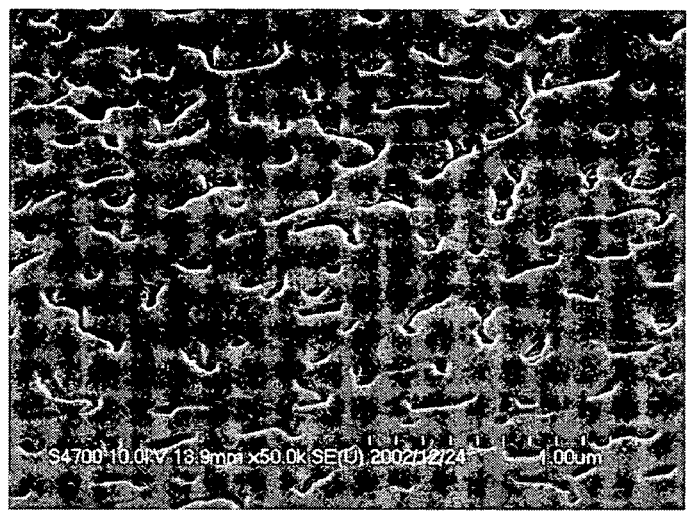
FIGS. 18A to 18C are micrographs of a surface state observed during a manufacturing process of an electrode according to an example of a method of manufacturing a second electrode.
Figure 18B:
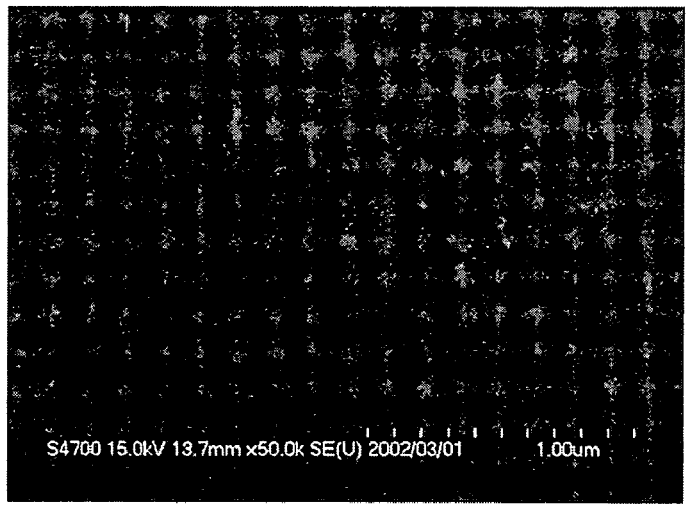
Figure 18C:
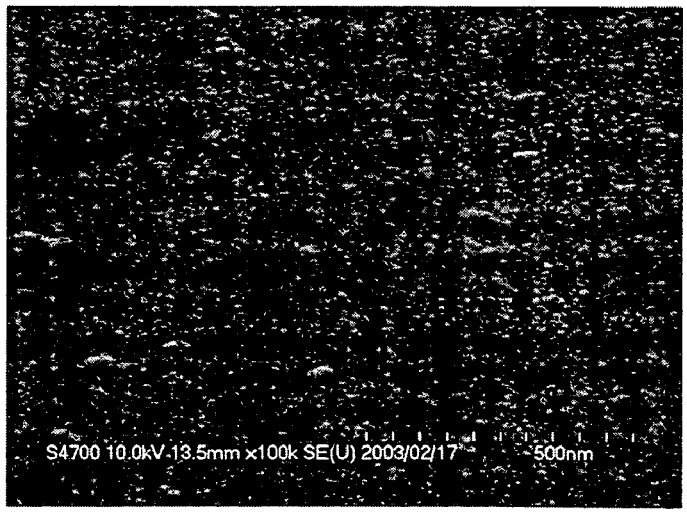

FIGS. 18A to 18C show surface morphology of the Pt—Ir complex electrode 48 formed by using the method of manufacturing an electrode of the present invention.

FIG. 18A shows Pt initial crystal nuclei (5 nm) and Pt grown layers (35 nm) formed to a thickness of 40 nm in total. As shown in FIG. 18A, the electrode cannot cover the entire PZT and has a large number of gaps (grain boundaries).

FIG. 18B shows a state in which Ir for reducing diffusion was implanted into the gaps (grain boundaries) of Pt crystals. It was confirmed that the Ir for reducing diffusion completely filled the gaps of the Pt crystals. Specifically, the electrode covered the entire PZT film in this stage. Moreover, Ir was concentrated to fill the grain boundaries of the Pt crystals.

FIG. 18C shows a state in which Pt was formed on the Pt electrode of FIG. 18B so that the total film thickness was 150 nm. The particle size in FIG. 18C completely differs from the particle size in FIG. 18A. The Pt initial crystal nuclei shown in FIG. 18A differ in grain boundaries from the Pt grown layers shown in FIG. 18C.

3. Device Application Example

An application example of an electrode obtained by using the above-described manufacturing method applied to a device is described below.

Figure 19B:
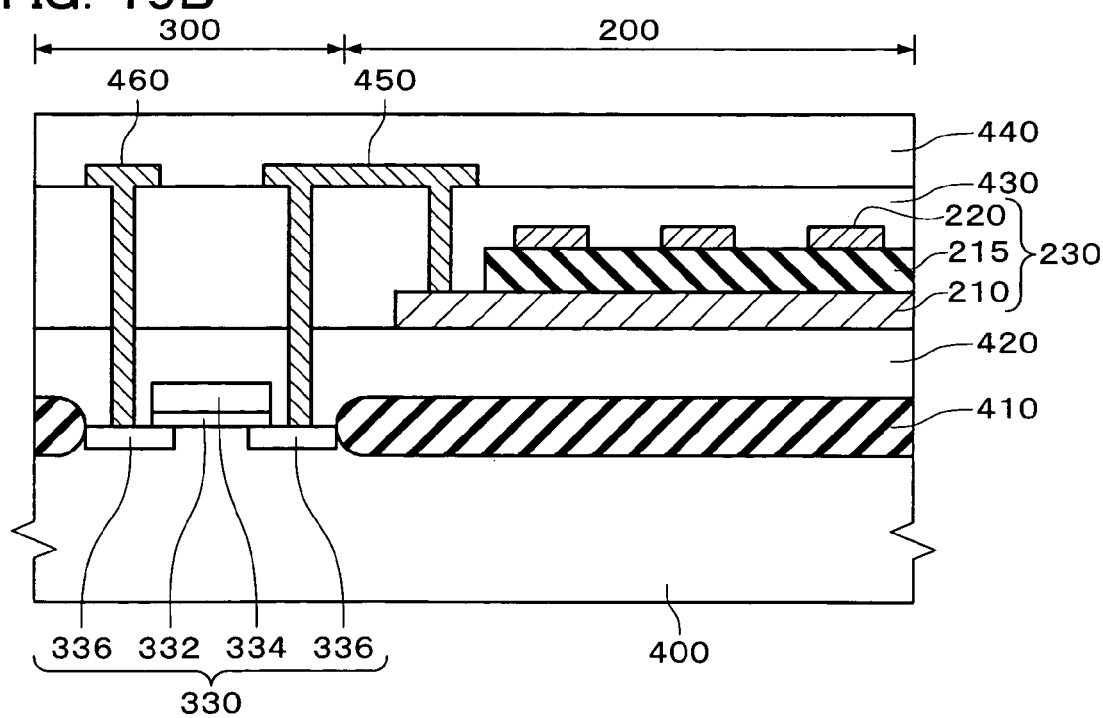

FIGS. 19A and 19B are views schematically showing a semiconductor device 1000 including a ferroelectric memory using an electrode obtained by using the above-described manufacturing method. FIG. 19A shows a planar shape of the semiconductor device 1000. FIG. 19B shows a cross section along the line 19B—19B shown in FIG. 19A.

As shown in FIG. 19A, the semiconductor device 1000 includes a ferroelectric memory cell array 200 and a peripheral circuit section 300. The ferroelectric memory cell array 200 and the peripheral circuit section 300 are formed in different layers. The peripheral circuit section 300 is disposed on a semiconductor substrate 400 in a region differing from the ferroelectric memory cell array 200. As specific examples of the peripheral circuit section 300, a Y gate, sense amplifier, input-output buffer, X address decoder, Y address decoder, or address buffer can be given.

In the ferroelectric memory cell array 200, lower electrodes 210 (wordlines) for selecting the row and upper electrodes 220 (bitlines) for selecting the column are arranged to intersect. The lower electrodes 210 and the upper electrodes 220 are in the shape of stripes formed of a plurality of linear signal electrodes. The signal electrodes may be formed so that the lower electrodes 210 are the bitlines and the upper electrodes 220 are the wordlines. Since the lower electrode 210 and the upper electrode 220 are formed by using the manufacturing method according to the above embodiment, the lower electrode 210 and the upper electrode 220 have few grain boundaries and have excellent flatness. Therefore, diffusion of constituent elements of a ferroelectric film 215, as described later, disposed between the lower electrode 210 and the upper electrode 220 into the lower electrode 210 and the upper electrode 220 can be reduced.

As shown in FIG. 19B, the ferroelectric layer 215 is disposed between the lower electrode 210 and the upper electrode 220. In the ferroelectric memory cell array 200, a memory cell which functions as a ferroelectric capacitor 230 is formed in an intersecting region of the lower electrode 210 and the upper electrode 220. It suffices that the ferroelectric film 215 be disposed between the lower electrode 210 and the upper electrode 220 at least in the intersecting region of the lower electrode 210 and the upper electrode 220.

In the semiconductor device 1000, a second interlayer dielectric film 430 is formed to cover the lower electrode 210, the ferroelectric film 215, and the upper electrode 220. An insulating protective layer 440 is formed on the second interlayer dielectric 430 so as to cover interconnect layers 450 and 460.

As shown in FIG. 19A, the peripheral circuit section 300 includes various circuits for selectively writing or reading data into or from the ferroelectric memory cell array 200. For example, the peripheral circuit section 300 includes a first driver circuit 310 for selectively controlling the lower electrodes 210, a second driver circuit 320 for selectively controlling the upper electrodes 220, and a signal detection circuit such as a sense amplifier (not shown), for example.

As shown in FIG. 19B, the peripheral circuit section 300 includes a MOS transistor 330 formed on the semiconductor substrate 400. The MOS transistor 330 includes a gate insulating film 332, a gate electrode 334, and source/drain regions 336. The MOS transistors 330 are separated by an element isolation region 410. A first interlayer dielectric 410 is formed on the semiconductor substrate 400 on which the MOS transistor 330 is formed. The peripheral circuit section 300 is electrically connected with the memory cell array 200 through an interconnect layer 51.

An example of write and read operations of the semiconductor device 1000 is described below.

In the read operation, a read voltage is applied to the capacitor of the selected memory cell. This also serves as a write operation of "0". At this time, current flowing through the selected bitline or a potential when causing the bitline to be in a high impedance state is read by using the sense amplifier. A given voltage is applied to the capacitors of the unselected memory cells in order to reduce occurrence of cross-talk during reading.

In the write operation of "1", a write voltage which causes the polarization state to be reversed is applied to the capacitor of the selected memory cell. In the case of writing "0", a write voltage which does not cause the polarization state to be reversed is applied to the capacitor of the selected memory cell, whereby the "0" state written during the read operation is retained. A given voltage is applied to the capacitors of the unselected memory cells in order to reduce occurrence of cross-talk during writing.

According to the semiconductor device 1000, the lower electrode 210 and the upper electrode 220 of the ferroelectric capacitor 230 formed by using the manufacturing method of the above embodiment have few grain boundaries and have excellent crystallinity and flatness. Therefore, the quality of the ferroelectric film 215 disposed between the lower electrode 210 and the upper electrode 220 can be improved, whereby the quality of the device and yield can be improved.

The embodiments of the present invention are described above. However, the present invention is not limited to these embodiments. Various modifications and variations are possible within the scope of the present invention.

What is claimed is:

1. A method of manufacturing an electrode over a substrate, the method comprising:
    (a) forming initial crystal nuclei of an electrode material over the substrate in an island pattern at a temperature from 200° C. to 600° C. by using a sputtering method; and
    (b) forming grown layers of the electrode material by causing the initial crystal nuclei to be grown at a temperature lower than 200° C. by using an evaporation method,
    wherein a substrate temperature in the step (a) is higher than a substrate temperature in the step (b).

2. The method of manufacturing an electrode as defined in claim 1,
    wherein a plurality of the electrodes are stacked by repeatedly performing the steps (a) and (b) a plurality of times.

3. The method of manufacturing an electrode as defined in claim 1, further comprising performing heat treatment after the step (b).

4. The method of manufacturing an electrode as defined in claim 1,
    wherein the electrode material is at least one of Pt, Ir, Ru, Cu, Ag, $IrO_2$, $RuO_2$, TiN, TaN, and $PbPt_3$.

5. The method of manufacturing an electrode as defined in claim 1, further comprising:
    filling at least gaps at grain boundaries of the grown layers with an electrode material for reducing diffusion after the step (b).

6. The method of manufacturing an electrode as defined in claim 5,
    wherein the electrode material for reducing diffusion is at least one of Ii, $IrO_2$, Ru, $RuO_2$, $HfO_2$, and $Al_2O_3$.

7. An electrode manufactured by the method as defined in claim 1.

8. A ferroelectric memory comprising the electrode as defined in claim 7.

9. A semiconductor device comprising the ferroelectric memory as defined in claim 8.

10. A method of manufacturing an electrode over a substrate, the method comprising:
    (a) forming initial crystal nuclei of an electrode material over the substrate in an island pattern at a temperature from 200° C. to 600° C. by using a sputtering method; and
    (b) forming grown layers of the electrode material by causing the initial crystal nuclei to be grown at a temperature lower than 200° C. by using an evaporation method,
    wherein energy of particles of the electrode material when forming the initial crystal nuclei is higher than energy of the particles of the electrode material when forming the grown layers.

* * * * *